United States Patent
Yamazaki et al.

(10) Patent No.: US 8,101,444 B2
(45) Date of Patent: Jan. 24, 2012

(54) METHOD FOR MANUFACTURING SEMICONDUCTOR DEVICE

(75) Inventors: Shunpei Yamazaki, Setagaya (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 176 days.

(21) Appl. No.: 12/222,251

(22) Filed: Aug. 6, 2008

(65) Prior Publication Data
US 2009/0047760 A1    Feb. 19, 2009

(30) Foreign Application Priority Data
Aug. 17, 2007  (JP) .................................. 2007-213059

(51) Int. Cl.
*H01L 21/84*    (2006.01)
(52) U.S. Cl. .................... 438/30; 438/158; 257/E21.561
(58) Field of Classification Search .................... 438/30, 438/151–166; 257/E21.561
See application file for complete search history.

(56) References Cited

U.S. PATENT DOCUMENTS

| | | |
|---|---|---|
| 4,409,134 A | 10/1983 | Yamazaki |
| 4,971,667 A | 11/1990 | Yamazaki et al. |
| 5,084,777 A | 1/1992 | Slobodin |
| 5,159,184 A | 10/1992 | Egawa et al. |
| 5,256,509 A | 10/1993 | Hayashi et al. |
| 5,453,858 A | 9/1995 | Yamazaki |
| 5,571,578 A | 11/1996 | Kaji et al. |
| 5,591,987 A | 1/1997 | Yamazaki et al. |
| 5,626,922 A | 5/1997 | Miyanaga et al. |
| 5,648,662 A | 7/1997 | Zhang et al. |
| 5,701,167 A | 12/1997 | Yamazaki |
| 5,766,989 A | 6/1998 | Maegawa et al. |
| 5,811,328 A | 9/1998 | Zhang et al. |
| 5,825,050 A | 10/1998 | Hirakawa |

(Continued)

FOREIGN PATENT DOCUMENTS
EP    0 473 988    3/1992
(Continued)

OTHER PUBLICATIONS

Arai. T et al., "41.2: Micro Silicon Technology for Active Matrix OLED Display," SID Digest '07: SID International Symposium Digest of Technical Papers, 2007, vol. XXXVIII, pp. 1370-1373.

(Continued)

*Primary Examiner* — Richard A. Booth
(74) *Attorney, Agent, or Firm* — Eric J. Robinson; Robinson Intellectual Property Law Office, P.C.

(57) ABSTRACT

Electric characteristics of a thin film transistor including a channel formation region including a microcrystalline semiconductor are improved. The thin film transistor includes a gate electrode, a gate insulating film formed over the gate electrode, a microcrystalline semiconductor layer formed over the gate insulating film, a semiconductor layer which is formed over the microcrystalline semiconductor layer and includes an amorphous semiconductor, and a source region and a drain region which are formed over the semiconductor layer. A channel is formed in the microcrystalline semiconductor layer when the thin film transistor is placed in an on state, and the microcrystalline semiconductor layer includes an impurity element for functioning as an acceptor. The microcrystalline semiconductor layer is formed by a plasma-enhanced chemical vapor deposition method. In forming the microcrystalline semiconductor layer, a process gas is excited with two or more kinds of high-frequency electric power with different frequencies.

12 Claims, 15 Drawing Sheets

U.S. PATENT DOCUMENTS

| | | | |
|---|---|---|---|
| 5,849,601 | A | 12/1998 | Yamazaki |
| 6,023,075 | A | 2/2000 | Yamazaki |
| 6,089,181 | A * | 7/2000 | Suemasa et al. .......... 118/723 E |
| 6,089,191 | A * | 7/2000 | Calinski et al. ............... 119/221 |
| 6,124,155 | A | 9/2000 | Zhang et al. |
| 6,162,709 | A * | 12/2000 | Raoux et al. ................... 438/513 |
| 6,166,399 | A | 12/2000 | Zhang et al. |
| 6,252,249 | B1 | 6/2001 | Yamazaki |
| 6,268,235 | B1 | 7/2001 | Sakakura et al. |
| 6,306,213 | B1 | 10/2001 | Yamazaki |
| 6,335,213 | B1 | 1/2002 | Zhang et al. |
| 6,570,552 | B2 | 5/2003 | Yamazaki |
| 6,756,258 | B2 | 6/2004 | Zhang et al. |
| 6,797,548 | B2 | 9/2004 | Zhang et al. |
| 6,847,064 | B2 | 1/2005 | Zhang et al. |
| 6,849,154 | B2 * | 2/2005 | Nagahata et al. ........ 156/345.47 |
| 7,051,671 | B2 * | 5/2006 | Aoki et al. ................ 118/723 E |
| 7,067,844 | B2 | 6/2006 | Yamazaki |
| 7,098,479 | B1 | 8/2006 | Yamazaki |
| 7,115,448 | B2 | 10/2006 | Tsujimura et al. |
| 7,115,902 | B1 | 10/2006 | Yamazaki |
| 7,125,588 | B2 | 10/2006 | Miyanaga et al. |
| 7,148,542 | B2 | 12/2006 | Yamazaki et al. |
| 2002/0008819 | A1 | 1/2002 | Yoshida |
| 2004/0188685 | A1 | 9/2004 | Lin et al. |
| 2005/0012097 | A1 | 1/2005 | Yamazaki |
| 2005/0017243 | A1 | 1/2005 | Zhang et al. |
| 2005/0176188 | A1 * | 8/2005 | Luo et al. ...................... 438/158 |
| 2006/0091394 | A1 | 5/2006 | Honda |
| 2006/0246639 | A1 | 11/2006 | Choi et al. |
| 2007/0018165 | A1 | 1/2007 | Yamazaki |
| 2008/0044962 | A1 | 2/2008 | Zhang et al. |
| 2008/0099826 | A1 | 5/2008 | Lai et al. |
| 2008/0105877 | A1 | 5/2008 | Yamazaki et al. |
| 2008/0182368 | A1 | 7/2008 | Kunii |
| 2009/0001375 | A1 | 1/2009 | Yamazaki et al. |
| 2009/0002591 | A1 | 1/2009 | Yamazaki et al. |
| 2009/0020759 | A1 | 1/2009 | Yamazaki |
| 2009/0039351 | A1 | 2/2009 | Kobayashi et al. |
| 2009/0039352 | A1 | 2/2009 | Kobayashi et al. |
| 2009/0045401 | A1 | 2/2009 | Yamazaki et al. |
| 2009/0047758 | A1 | 2/2009 | Yamazaki et al. |
| 2009/0047759 | A1 | 2/2009 | Yamazaki et al. |
| 2010/0044713 | A1 | 2/2010 | Miyaguchi et al. |

FOREIGN PATENT DOCUMENTS

| | | |
|---|---|---|
| JP | 60-098680 | 6/1985 |
| JP | 61-087371 | 5/1986 |
| JP | 04-242724 | 8/1992 |
| JP | 06-077483 | 3/1994 |
| JP | 07-211708 | 8/1995 |
| JP | 11-121761 | 4/1999 |
| JP | 2001-007024 | 1/2001 |
| JP | 2001-127296 | 5/2001 |
| JP | 2002-246605 | 8/2002 |
| JP | 2005-049832 | 2/2005 |
| JP | 2005-167051 | 6/2005 |
| JP | 2007-005508 | 1/2007 |
| JP | 2007-035964 | 2/2007 |
| JP | 2007-049171 | 2/2007 |

OTHER PUBLICATIONS

Lee. C et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee. C et al., "High-Mobility N-Channel and P-Channel Nanocrystalline Silicon Thin-Film Transistors," IEEE, 2005, pp. 937-940.

Lee. C et al., "Directly Deposited Nanocrystalline Silicon Thin-Film Transistors with Ultra High Mobilities," Appl. Phys. Lett. (Applied Physics Letters), Dec. 18, 2006, vol. 89, pp. 252101-1-252101-3.

Lee. C et al., "How to Achieve High Mobility Thin Film Transistors by Direct Deposition of Silicon Using 13.56 MHz RF PECVD?," IEDM, 2006, pp. 295-298.

Esmaeili-Rad. M et al., "High Stability, Low Leakage Nanocrystalline Silicon Bottom Gate Thin Film Transistors for AMOLED Displays," IEEE, 2006, pp. 303-306.

Lee. H et al., "Leakage Current Mechanisms in Top-Gate Nanocrystalline Silicon Thin-Film Transistors," Appl. Phy. Lett. (Applied Physics Letters); Feb. 28, 2008, vol. 92, pp. 083509-1-083509-3.

Esmaeili-Rad. M et al., "Absence of Defect State Creation in Nanocrystalline Silicon Thin Film Transistors Deduced from Constant Current Stress Measurements," Appl. Phys. Lett. (Applied Physics Letters), Sep. 12, 2007, vol. 91, pp. 113511-1-113511-3.

Lee. C et al., "Stability of nc-SI:H TFTs with Silicon Nitride Gate Dielectric,", IEEE Transactions of Electron Devices, 2007, vol. 54, No. 1, pp. 45-51.

Sazonov. A et al., "Low-Temperature Materials and Thin Film Transistors for Flexible Electronics," Proceedings of the IEEE, Aug. 1, 2005, vol. 93, No. 8, pp. 1420-1428.

Esmaeili-Rad. M et al., "Stability of Nanocrystalline Silicon Bottom-Gate Thin Film Transistors with Silicon Nitride Gate Dielectric," J. Appl. Phys. (Journal of Applied Physics), Sep. 28, 2007, vol. 102, pp. 064512-1-064512-7.

Lee. C et al., "Top-Gate TFTs Using 13.56 MHz PECVD Microcrystalline Silicon," IEEE Electron Device Letters, Sep. 5, 2005, vol. 26, No. 9, pp. 637-639.

Lee. C et al., "Postdeposition Thermal Annealing and Material Stability of 75 °C Hydrogenated Nanocrystalline Silicon Plasma-Enhanced Chemical Vapor Deposition Films," J. Appl. Phys. (Journal of Applied Physics). Aug. 4, 2005, vol. 98, pp. 034305-1-034305-7.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device including a thin film transistor.

2. Description of the Related Art

A technique in which a thin film transistor (hereinafter also referred to as a "TFT") is formed using a thin semiconductor film (with a thickness of several nm to several hundreds of nm, approximately) formed over a substrate having an insulating surface is known. Structures of TFTs can be roughly classified into two types. One is a top gate type, in which a gate electrode is formed over a channel formation region; the other is a bottom gate type, in which a gate electrode is formed under a channel formation region. TFTs are widely applied to electronic devices such as integrated circuits or active matrix liquid crystal display devices. In an active matrix liquid crystal display device, thin film transistors are used as switching elements of pixels. An amorphous silicon film, a polycrystalline silicon film, a microcrystalline silicon film, or the like is used for a thin semiconductor film of this thin film transistor.

An amorphous silicon film used in a thin film transistor is generally formed by a plasma-enhanced chemical vapor deposition method. A polycrystalline silicon film is formed by forming an amorphous silicon film by a plasma-enhanced chemical vapor deposition method (hereinafter referred to as a "PECVD method") and crystallizing the amorphous silicon film. In one of the typical crystallization methods, an excimer laser beam is processed into a linear form with an optical system, and an amorphous silicon film is irradiated with the linear beam as the linear beam is moved.

The present applicant has developed a thin film transistor in which a semiamorphous semiconductor film is used for a thin semiconductor film (see Reference 1: Japanese Published Patent Application No. H4-242724; Reference 2: Japanese Published Patent Application No. 2005-49832; and Reference 3: U.S. Pat. No. 5,591,987).

A microcrystalline silicon film can be formed by a chemical vapor deposition method (hereinafter referred to as a "CVD method") such as a PECVD method, or a physical vapor deposition method (hereinafter referred to as a "PVD method") such as a sputtering method, and can also be formed by crystallizing an amorphous silicon film as shown in Reference 4 (Toshiaki Arai et al., "Micro Silicon Technology for Active Matrix OLED Display," *Society for Information Display* 2007 *International Symposium Digest of Technical Papers*, pp. 1370-1373). The crystallization method in Reference 4 is as follows: an amorphous silicon film is formed, and then a metal film is formed over an upper surface of the amorphous silicon film; the metal film is irradiated with a laser beam that has a wavelength of 800 nm and is emitted from a diode laser; the metal film absorbs light, thereby being heated; and then, the amorphous silicon film is heated by the heat conduction from the metal film, thereby being modified into a microcrystalline silicon film. The metal film is formed to convert light energy into heat energy. The metal film is removed in a process of manufacturing a thin film transistor.

SUMMARY OF THE INVENTION

In a bottom gate TFT, a semiconductor film for forming a channel formation region is formed after forming a gate insulating layer. This semiconductor film is formed by a PECVD method, which enables a film to be formed over a substrate having a large area in a high throughput.

In order to increase field effect mobility of a bottom gate TFT including a microcrystalline semiconductor film, crystallinity of the microcrystalline semiconductor film may be improved. It is necessary to deposit a microcrystalline semiconductor film with high crystallinity at an early stage of depositing the film by a PECVD method because a carrier path in the microcrystalline semiconductor film is present near an interface between the microcrystalline semiconductor film and a gate insulating layer.

In view of the above challenge, an object of the present invention is to provide a method for manufacturing a semiconductor device including a thin film transistor which includes a microcrystalline semiconductor layer and has improved field effect mobility.

An aspect of the present invention is a method for manufacturing a semiconductor device including a thin film transistor including a gate electrode, a channel formation region, a source region, and a drain region. The manufactured thin film transistor includes the gate electrode; a gate insulating layer that is formed over the gate electrode; a first semiconductor layer that is formed over the gate insulating layer, is formed of a microcrystalline semiconductor including an acceptor impurity element and oxygen, and includes a channel formation region; a second semiconductor layer that is formed over the gate insulating layer and formed of an amorphous semiconductor; and a pair of third semiconductor layers that are formed over the second semiconductor layer and include a source region and a drain region, respectively. Further, a step of forming the first semiconductor layer includes a step of forming a microcrystalline semiconductor layer including the acceptor impurity element, using a process gas including a dopant gas including the acceptor impurity element, by a plasma-enhanced chemical vapor deposition method; and a step of generating plasma by supplying two or more kinds of high-frequency electric power having different frequencies to the process gas for forming the microcrystalline semiconductor layer.

The microcrystalline semiconductor layer including the acceptor impurity element is formed, whereby the threshold voltage of the thin film transistor can be controlled. Addition of the acceptor impurity element is effective for an n-channel thin film transistor. For example, a gas selected from trimethylboron, $B_2H_6$, $BF_3$, $BCl_3$, and $BBr_3$ can be used for the dopant gas, and boron is added as the acceptor impurity element to the microcrystalline semiconductor layer.

Two or more kinds of high-frequency electric power having different frequencies are supplied to a process gas in forming a microcrystalline semiconductor layer, whereby plasma can have a higher density. Thus, a microcrystalline semiconductor layer with high crystallinity is formed. That is to say, a method for manufacturing a semiconductor device including a thin film transistor with high field effect mobility can be provided by the present invention.

DETAILED DESCRIPTION OF THE INVENTION

Figure 1:
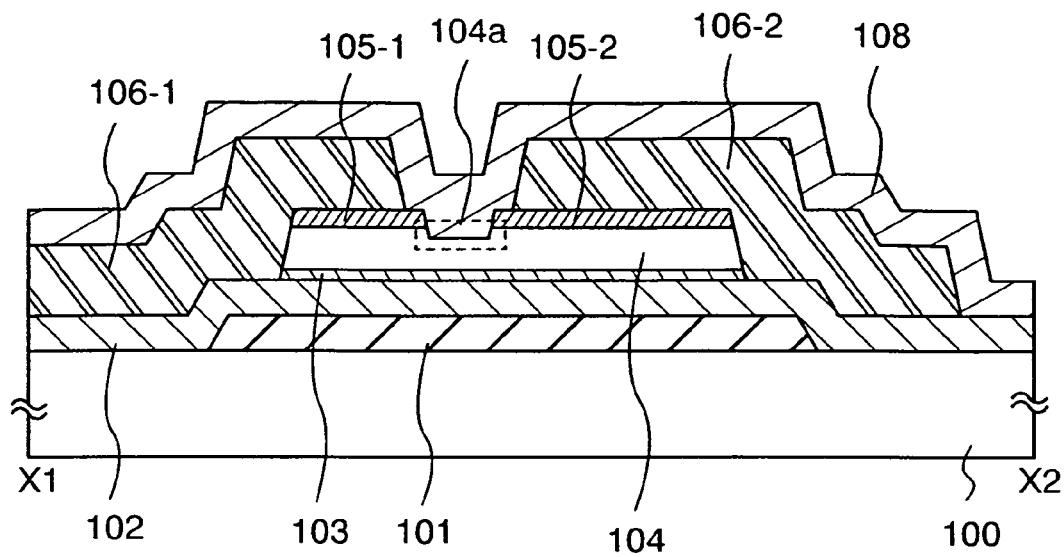
FIG. 1 is a cross-sectional view of a thin film transistor.

Hereinafter, embodiment modes of the present invention are described. It is easily understood by those skilled in the art that the present invention can be carried out in many different modes, and the modes and details disclosed herein can be modified in various ways without departing from the spirit and scope of the present invention. Therefore, the present invention should not be interpreted as being limited to the description of the embodiment modes to be given below. Further, the same reference numeral in different drawings represents the same component, and repeated description of a material, a shape, a manufacturing method, or the like is omitted.

Embodiment Mode 1

This embodiment mode describes a structure of a bottom gate TFT in the present invention and a manufacturing method thereof. Specifically, this embodiment mode describes a TFT with a channel-etched structure and a manufacturing method thereof.

Figure 2:
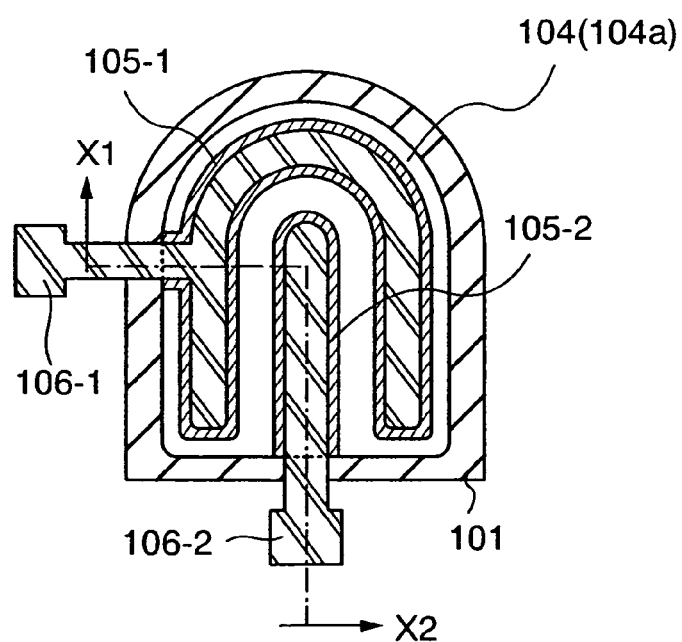
FIG. 2 is a top view of a thin film transistor.

FIG. 1 is a cross-sectional view illustrating an example of a structure of the TFT, and FIG. 2 is a top view thereof. FIG. 1 is a cross-sectional view taken along a line X1-X2 in FIG. 2.

The TFT is formed over a substrate 100. In the TFT, a first conductive layer 101, an insulating layer 102, a first semiconductor layer 103, a second semiconductor layer 104, and a pair of third semiconductor layers 105-1 and 105-2 are stacked from the substrate side. The first conductive layer 101 forms a gate electrode of the TFT. The insulating layer 102 forms a gate insulating layer of the TFT. The first semiconductor layer is formed of a microcrystalline semiconductor including an impurity element that functions as an acceptor, and includes a channel formation region of the TFT. The second semiconductor layer 104 is formed of an amorphous semiconductor. The pair of third semiconductor layers 105-1 and 105-2 are each formed of an n-type or p-type semiconductor, and function as a source region or a drain region.

A typical example of the first semiconductor layer 103 is a microcrystalline silicon layer, and a typical example of the second semiconductor layer 104 is an amorphous silicon layer. Further, typical examples of the third semiconductor layers 105-1 and 105-2 are microcrystalline silicon layers or amorphous silicon layers. The first semiconductor layer 103 is formed of a microcrystalline semiconductor layer which has a short-range order in crystallinity, and in which minute crystal grains with a diameter of from 0.5 to 20 nm inclusive are dispersed in an amorphous semiconductor. A Raman spectrum of microcrystalline silicon, which is a typical example of a microcrystalline semiconductor, is shifted in lower wave numbers than 520.6 cm$^{-1}$, which represents a Raman spectrum of single-crystalline silicon. Typically, a peak of the Raman spectrum of microcrystalline silicon lies in a range of from 481 to 520.6 cm$^{-1}$ inclusive. It is preferable that the first semiconductor layer 103 include hydrogen or halogen at 1 at. % or more in order to terminate a dangling bond. Further, the microcrystalline silicon that constitutes the first semiconductor layer 103 may have lattice distortion. If a rare gas element such as helium, argon, krypton, or neon is included in the first semiconductor layer 103 to promote lattice distortion further, a favorable microcrystalline semiconductor with increased stability can be obtained.

A pair of second conductive layers 106-1 and 106-2 that function as a source electrode or a drain electrode are electrically connected to the TFT. The second conductive layers 106-1 and 106-2 are formed over the third semiconductor layers 105-1 and 105-2. Further, the TFT is covered with an insulating layer 108 that functions as a passivation film.

The first semiconductor layer 103 is formed of a microcrystalline semiconductor, and the second semiconductor layer 104 is formed of an amorphous semiconductor. An amorphous semiconductor has a larger band gap and higher resistance than a microcrystalline semiconductor. For example, the band gap of microcrystalline silicon is 1.1 to 1.5 eV approximately, and that of amorphous silicon is 1.6 to 1.8 eV approximately. Further, an amorphous semiconductor has as low carrier mobility as $\frac{1}{5}$ to $\frac{1}{10}$ of that of a microcrystalline semiconductor. The channel formation region is constituted of a microcrystalline semiconductor layer forming the first semiconductor layer 103. Further, the second semiconductor layer 104 functions as a high resistant region, and has effects of reduction in leakage current in an off state and suppression of TFT deterioration.

Next, an operation of the TFT is described by taking an example in which the TFT is an n-channel TFT in which the pair of third semiconductor layers 105-1 and 105-2 are formed of an n-type semiconductor layer; the third semiconductor layer 105-1 is the source region; and the third semiconductor layer 105-2 is the drain region.

When a voltage which is higher than or equal to a threshold voltage is applied to the first conductive layer 101 to turn the TFT on, a channel is formed in the first semiconductor layer 103, and carriers (electrons in this case) travel from the third semiconductor layer 105-1 (the source region) to the third semiconductor layer 105-2 (the drain region) through the second semiconductor layer 104 and the first semiconductor layer 103. In other words, electric current flows from the third semiconductor layer 105-2 to the third semiconductor layer 105-1.

The field effect mobility and electric current which flows in an on-state of the TFT in FIGS. 1 and 2 are higher than those of a TFT in which a channel is formed of an amorphous semiconductor because the first semiconductor layer is formed of a microcrystalline semiconductor in the TFT in FIGS. 1 and 2. The reason is that a microcrystalline semiconductor has higher crystallinity than an amorphous semiconductor, and thus the former has lower resistance than the latter. The "crystallinity" represents a level of regularity of arrangement of atoms that constitute a solid body. Methods of measuring crystallinity are a Raman spectroscopy method, an X-ray diffraction method, and the like.

A microcrystalline semiconductor film is not an intrinsic semiconductor film but has low n-type conductivity when any impurity element for controlling valence electrons is not added thereto intentionally. The reason is that a microcrystalline semiconductor film has a dangling bond or a defect, and thus free electrons are generated in the semiconductor. Further, another reason for a microcrystalline semiconductor film's assuming a weak n-type is that it includes oxygen.

In a process of manufacturing a TFT, although a microcrystalline semiconductor film is made to grow over a substrate by a CVD method or a PVD method in a hermetic reaction chamber, it is difficult to make the microcrystalline semiconductor film grow over the substrate so that oxygen in the atmosphere is not included at all in the microcrystalline semiconductor film, and thus oxygen enters the microcrystalline semiconductor film at a concentration of greater than or equal to $1 \times 10^{17}$ atoms/cm$^3$. The oxygen which has entered the film causes a defect in the crystallinity of the microcrystalline semiconductor film, and the defect generates a free electron. In other words, the oxygen functions as a donor impurity element for the microcrystalline semiconductor film.

Therefore, it is preferable to add an impurity element which functions as an acceptor to the first semiconductor layer 103, which functions as the channel formation region of the thin film transistor, to substantially make the first semiconductor layer 103 an intrinsic semiconductor film. Addition of the impurity element which functions as an acceptor to the first semiconductor layer 103 can control the threshold voltage of the TFT. As a result, when an n-channel TFT and a p-channel TFT are formed over one substrate, both the TFTs can be enhancement-mode transistors. In order to make an n-channel TFT an enhancement-mode transistor, the first semiconductor layer 103 may be intrinsic or may assume weak p-type conductivity.

If the microcrystalline semiconductor film includes an element of Group 4, a typical acceptor impurity element is boron. In order to make the first semiconductor layer 103 intrinsic or a weak p-type, it is preferable that the first semiconductor layer 103 include the acceptor impurity element at a concentration of from $1 \times 10^{14}$ to $6 \times 10^{16}$ atoms/cm$^3$. Oxygen oxidizes the semiconductor film and thus causes decrease in the field effect mobility of the TFT as well as functioning as a donor impurity element; thus, it is preferable that an oxygen concentration of the first semiconductor layer 103 be less than or equal to $5 \times 10^{18}$ atoms/cm$^3$, more preferably less than or equal to $5 \times 10^{17}$ atoms/cm$^3$.

When the potential of the first conductive layer 101 is made to be lower than the threshold voltage, the TFT is placed in an off state. Ideally, any electric current should not flow between the source region and the drain region of the TFT in an off state. Current which flows between the source region and the drain region when the TFT is in an off state is called "leakage current." In the TFT as shown in FIGS. 1 and 2, which includes the semiconductor film in which the first semiconductor layer 103 and the second semiconductor layer 104 are stacked, an upper portion of the semiconductor film becomes a path of carriers, which generates leakage current, by the action of an electric field produced by the first conductive layer 101 when the TFT is in an off state. Therefore, the portion where leakage current easily flows in the semiconductor film of the TFT is formed of the second semiconductor layer 104 formed of an amorphous semiconductor, thereby reducing leakage current in the TFT including the channel formation region formed of a microcrystalline semiconductor.

Specifically, in the TFT shown in FIGS. 1 and 2, a portion of the semiconductor film on the gate electrode side (the gate insulating layer side), in which the channel formation region is formed, is formed using a microcrystalline semiconductor layer, and the semiconductor film on a side in contact with the source region and the drain region is formed using an amorphous semiconductor layer, thereby increasing current which flows in an on state, and decreasing current which flows in an off state.

The second semiconductor layer 104 functions as a buffer layer and prevents oxidation of the first semiconductor layer 103, in which the channel is formed. Preventing the oxidation of the first semiconductor layer 103 can prevent decrease in field effect mobility of the TFT. Accordingly, the first semiconductor layer 103 including the channel formation region can be formed with a small thickness. It is acceptable as long as the thickness of the first semiconductor layer 103 is larger than 5 nm, preferably less than or equal to 50 nm, more preferably less than or equal to 20 nm.

Further, the second semiconductor layer 104 formed of an amorphous semiconductor is formed between the first semiconductor layer 103 and the pair of third semiconductor layers 105-1 and 105-2 (the source region and the drain region), whereby the dielectric strength voltage of the TFT can be improved; thus, deterioration of the TFT is suppressed and the reliability of the TFT can be improved.

Further, the second semiconductor layer 104 is formed using an amorphous semiconductor, between the first semiconductor layer 103 and the pair of third semiconductor layers 105-1 and 105-2 (the source region and the drain region), whereby parasitic capacitance can be reduced.

The second semiconductor layer 104 is provided with a recessed portion 104a, and the thickness of a portion of the second semiconductor layer 104 where it overlaps with the third semiconductor layers 105-1 and 105-2 can be larger than that of the first semiconductor layer 103, and can be from 100 to 500 nm inclusive, preferably from 200 to 300 nm inclusive. Also in a case where a high voltage (e.g., 15 V, approximately) is applied to the gate electrode to operate the TFT, deterioration of the TFT can be suppressed by forming the second semiconductor layer 104 with a large thickness of from 100 to 500 nm inclusive.

Further, the second semiconductor layer 104 is formed using an amorphous semiconductor, thereby improving the electric characteristics and the reliability of the TFT; thus, the first semiconductor layer 103 for functioning as the channel formation region can be made to be thin while deterioration of the electric characteristics of the thin film transistor which is due to oxidation of the semiconductor film, increase in parasitic capacitance of the thin film transistor, and deterioration of the thin film transistor when a high voltage is applied to the thin film transistor are suppressed.

Next, a method for manufacturing the thin film transistor in FIGS. 1 and 2 is described with reference to FIGS. 3A to 3D and FIGS. 4A to 4C.

First, the substrate 100 is prepared. For the substrate 100, an alkali-free glass substrate manufactured by a fusion method or a float method, such as barium borosilicate glass, aluminoborosilicate glass, or aluminosilicate glass; a ceramic substrate; a plastic substrate which has high heat resistance enough to withstand a process temperature of this manufacturing process; or the like can be used. Further, a metal (e.g., stainless steel alloy) substrate whose surface is provided with an insulating film may be used.

Figure 3A:
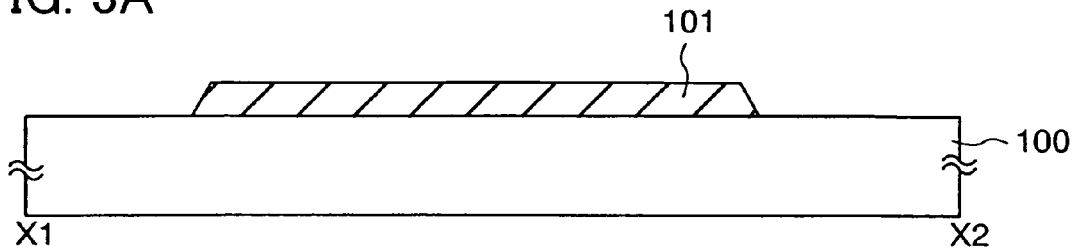
FIGS. 3A to 3D are cross-sectional views illustrating a method for manufacturing a thin film transistor.

Next, the first conductive layer 101 is formed over the substrate 100 (see FIG. 3A). First, a conductive film with a single-layer structure or a stacked-layer structure formed of a conductive material which is selected from metals such as titanium, molybdenum, chromium, tantalum, tungsten, and aluminum, and an alloy including the above metal is formed. This conductive film can be formed by a sputtering method or a vacuum vapor deposition method. Then, a mask is formed over the conductive film by a photolithography technique or an inkjet method, and the conductive film is etched using the mask, whereby the first conductive layer 101 with a given shape is formed.

The first conductive layer 101 can also be formed without utilizing the etching treatment. A conductive nanopaste of silver, gold, copper, or the like is discharged by an inkjet method so as to have a given shape, and then is baked, whereby the first conductive layer 101 with a given shape can be formed. Further, a metal nitride film can be formed between the substrate 100 and the first conductive layer 101 as a barrier layer, which improves adhesion of the first conductive layer 101 and prevents a metal element from diffusing. The barrier layer can be formed using a nitride film of titanium, molybdenum, chromium, tantalum, tungsten, or aluminum.

A semiconductor film and a wiring are formed over the first conductive layer 101, and thus the first conductive layer 101 is preferably processed to have a tapered end portion in order to prevent disconnection of the films thereover. In FIGS. 3A to 3D, the end portion of the first conductive layer 101 is processed to have a tapered shape.

Next, the insulating layer 102, a microcrystalline semiconductor layer 123 that constitutes the first semiconductor layer 103, an amorphous semiconductor layer 124, and a semiconductor layer 125 having n-type or p-type conductivity (hereinafter also referred to as the "semiconductor layer 125") are formed in this order over the first conductive layer 101 (see FIG. 3B). It is acceptable as long as the thickness of the microcrystalline semiconductor layer 123 is larger than 5 nm, preferably less than or equal to 50 nm, more preferably less than or equal to 20 nm. The amorphous semiconductor layer 124 is formed with a thickness of from 100 to 500 nm inclusive, preferably from 200 to 300 nm inclusive.

It is preferable to successively form the insulating layer 102, the microcrystalline semiconductor layer 123, the amorphous semiconductor layer 124, and the semiconductor layer 125 having n-type or p-type conductivity. Specifically, after forming the insulating layer 102, the semiconductor layers 123 to 125 are formed successively without exposing the substrate 100 to the atmosphere, thereby preventing each interface between the layers from being contaminated with atmospheric components such as oxygen or nitrogen, or with impurity elements in the atmosphere; thus, variation in electric characteristics of TFTs can be reduced.

The insulating layer 102 can be formed using a silicon oxide film, a silicon nitride film, a silicon oxynitride film, or a silicon nitride oxide film. Each insulating film can be formed by a CVD method or a sputtering method. If the insulating film is formed by a CVD method, a PECVD method is preferably used; in particular, plasma is preferably generated by exciting a process gas with microwaves having a frequency of greater than or equal to 1 GHz. A silicon oxynitride film or a silicon nitride oxide film which is formed by vapor deposition using plasma excited with microwaves has high dielectric strength voltage, and thus the reliability of the TFT can be improved.

Note that silicon oxynitride means a substance that includes more oxygen than nitrogen, and includes oxygen, nitrogen, silicon, and hydrogen at concentrations ranging from 55 to 65 at. %, 1 to 20 at. %, 25 to 35 at. %, and 0.1 to 10 at. %, respectively. Further, silicon nitride oxide means a substance that includes more nitrogen than oxygen, and includes oxygen, nitrogen, silicon, and hydrogen at concentrations ranging from 15 to 30 at. %, 20 to 35 at. %, 25 to 35 at. %, and 15 to 25 at. %, respectively.

The insulating layer 102 can have a single-layer structure or a stacked-layer structure. For example, when the insulating layer 102 has a two-layer structure, a lower layer is formed using a silicon oxide film or a silicon oxynitride film, and an upper layer is formed using a silicon nitride film or a silicon nitride oxide film. When the insulating layer 102 has a three-layer structure, for example, a layer on the substrate 100 side can be formed using a silicon nitride film or a silicon nitride oxide film; a middle layer can be formed using a silicon oxide film or a silicon oxynitride film; and the layer on the microcrystalline semiconductor layer 123 side can be formed using a silicon nitride film or a silicon nitride oxide film.

The microcrystalline semiconductor layer 123 has short-range order in crystallinity, and in which minute crystal grains with a diameter of from 0.5 to 20 nm inclusive are dispersed in an amorphous semiconductor.

The microcrystalline semiconductor layer is formed by a PECVD method. In addition to a silicon source gas, hydrogen can be mixed in a process gas. Furthermore, a rare gas such as helium, argon, krypton, or neon can be mixed in a process gas. The concentration of the rare gas such as helium, argon, krypton, or neon in the process gas is controlled, so that the rare gas element can be added to the microcrystalline semiconductor layer 123.

Further, if a gas including a halogen element (e.g., $F_2$, $Cl_2$, $Br_2$, $I_2$, HF, HCl, HBr, or HI) is mixed in a process gas, or if a silicon source gas including halogen (e.g., $SiH_2Cl_2$, $SiHCl_3$, $SiCl_4$, or $SiF_4$) is used, halogen can be added to the microcrystalline semiconductor layer 123. If $SiF_4$ is used, a mixed gas of $SiF_4$ and $SiH_4$ is preferably used as a silicon source gas.

Furthermore, the acceptor impurity element is added to the microcrystalline semiconductor layer 123 to make the microcrystalline semiconductor layer 123 an intrinsic semiconductor layer or a weak n-type semiconductor layer. A preferable concentration of the acceptor impurity element in the microcrystalline semiconductor layer 123 is from $1 \times 10^{14}$ to $6 \times 10^{16}$ atoms/cm$^3$, for example. If the microcrystalline semiconductor layer 123 is formed by a CVD method, a dopant gas including the acceptor impurity element is mixed in a process gas. The concentration of the acceptor impurity element in the microcrystalline semiconductor layer 123 can be controlled with the partial pressure of the dopant gas. The partial pressure of the dopant gas can be controlled with the flow rate and the dilution rate of the dopant gas when the dopant gas is supplied into a reaction chamber. For example, when the pressure of the atmosphere is 150 Pa±20 Pa approximately, it is preferable that a partial pressure of the dopant gas be from $1 \times 10^{-8}$ to $1 \times 10^{-5}$ Pa inclusive.

A typical acceptor impurity element is boron. For a dopant gas including the acceptor impurity element, a gas of $B_2H_6$, $BF_3$, $BCl_3$, $BBr_3$, trimethylboron ($B(CH_3)_3$), or the like can be used. $B_2H_6$ is apt to be adsorbed, and it is difficult to remove $B_2H_6$ out of a reaction chamber by plasma cleaning. Trimethylboron (hereinafter referred to as "TMB") has an advantage that it can be removed out of a reaction chamber by plasma cleaning with more ease than $B_2H_6$. Further, TMB has another advantage that it is less apt to be decomposed than $B_2H_6$, and thus it can be preserved for a longer time.

In a case of forming a microcrystalline silicon film as the microcrystalline semiconductor layer 123, a process gas includes at least a silicon source gas, a dopant gas, and hydrogen. A rare gas such as helium can also be mixed in the process gas instead of hydrogen. In order to form the microcrystalline silicon film, it is preferable that the partial pressure of hydrogen be 50 or more times as high as that of the silicon source gas, and can be 50 to 2000 times as high as that of the silicon source gas. The deposition rate of the silicon film is decreased by increasing the ratio of the partial pressure of hydrogen to the partial pressure of the silicon source gas, and thus a crystal nucleus is easily generated and the film is microcrystallized. The substrate can be heated at a temperature of from 100 to 300° C. inclusive. Further, the pressure of the atmosphere can be from 100 to 300 Pa inclusive.

Further, it is preferable that an oxygen concentration of the microcrystalline semiconductor layer 123 be less than or equal to $1 \times 10^{19}$ atoms/cm$^3$, more preferably less than or equal to $5 \times 10^{18}$ atoms/cm$^3$. Examples of methods for reducing oxygen are to reduce oxygen which is adsorbed by the substrate 100, to reduce the amount of air which leaks into a reaction chamber for forming the microcrystalline semiconductor layer 123, to shorten film formation time by increasing a deposition rate of the microcrystalline semiconductor layer 123, and the like.

In order to form the microcrystalline semiconductor layer 123, two or more kinds of high-frequency electric power having different frequencies are supplied to a process gas to excite the process gas. Two or more kinds of high-frequency electric power having different frequencies are supplied to an electrode of a PECVD apparatus, whereby the high-frequency electric power having different frequencies can be supplied to the process gas. Thus, the process gas is excited to generate plasma, and the microcrystalline semiconductor layer 123 is formed. Different frequencies mean different wavelengths.

There are at least two kinds of high-frequency electric power that are applied to the electrode. One is electric power in a frequency band in which a surface standing wave effect is not caused, and a wavelength thereof is approximately greater than or equal to 10 m. Another is high-frequency electric power having a smaller wavelength than the aforementioned high-frequency electric power. Such two kinds of high-frequency electric power are applied to the electrode of the PECVD apparatus so that the two kinds of high-frequency electric power are superposed on each other, whereby plasma can have a higher density. Further, a plasma surface standing effect is suppressed, and thus the plasma can be uniform.

Figure 19:
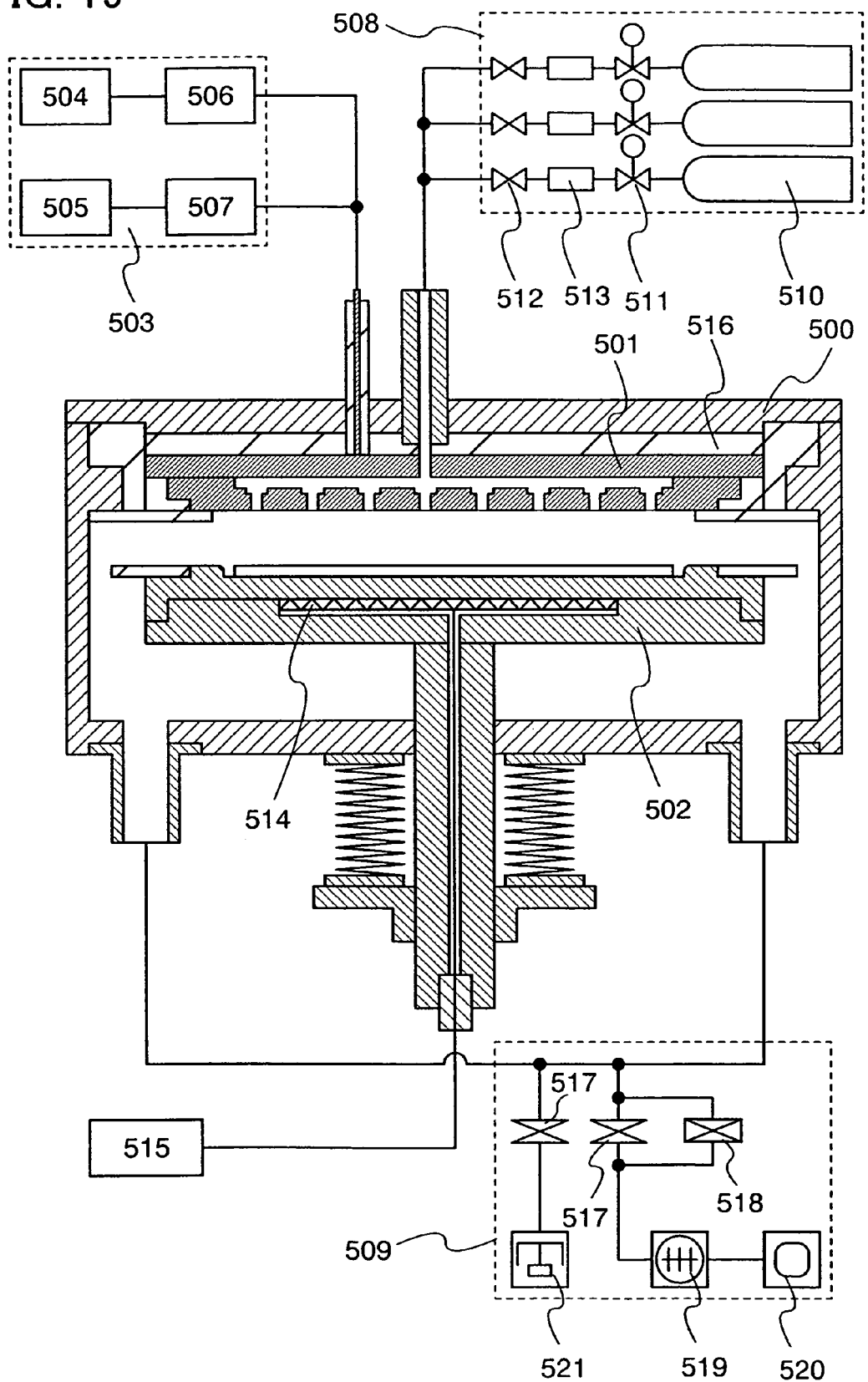
FIG. 19 is a block diagram and a cross-sectional view illustrating a structure of a PECVD apparatus.

FIG. 19 shows a structural example of a PECVD apparatus which applies plural kinds of high-frequency electric power. A reaction chamber 500, whose inside can be evacuated, is formed of a stiff material such as aluminum or stainless steel. The reaction chamber 500 is provided with a first electrode 501 and a second electrode 502.

A high-frequency electric power supply unit 503 is connected to the first electrode 501. The second electrode 502 is supplied with ground potential. A substrate can be disposed on the second electrode 502. The first electrode 501 is isolated from the reaction chamber 500 by an insulator 516 so that high-frequency electric power may not leak from the first electrode 501. Although FIG. 19 shows a structural example in which the first electrode 501 and the second electrode 502 have a capacitive coupling (a parallel plate) structure, another structure such as an inductive coupling type can also be employed as long as the structure enables plasma to be generated in the reaction chamber 500 by applying two or more kinds of high-frequency electric power.

The high-frequency electric power supply unit 503 includes a first high-frequency electric power source 504 and a second high-frequency electric power source 505, and a first matching device 506 and a second matching device 507 corresponding thereto. Both high-frequency electric power which is output from the first high-frequency electric power source 504 and that from the second high-frequency electric power source 505 are supplied to the first electrode 501. The first matching device 506 or the second matching device 507 may be provided with a bandpass filter on an output side thereof so that high-frequency electric power from one side cannot enter the other.

The first electrode 501 is also connected to a gas supply unit 508. The gas supply unit 508 includes cylinder 510, which are filled with various gases such as SiH$_4$, pressure control valves 511, stop valves 512, mass flow controllers 513, and the like. A dopant gas such as TMB or PH$_3$ fills the cylinder 510, diluted with a gas such as H$_2$ or He.

In the reaction chamber 500, a surface of the first electrode 501 which faces a substrate is processed to have a shower plate form, and is provided with a large number of pores. A reaction gas that is supplied to the first electrode 501 passes through a hollow portion in the first electrode 501, and is supplied into the reaction chamber 500 through the pores.

The second electrode 502 is provided with a substrate heater 514 and a heater controller 515 for controlling the temperature of the substrate heater 514. If the substrate heater 514 is provided in the second electrode 502, a heat conduction heating method is employed and the substrate heater 514 is constituted of a sheath heater or the like. The second electrode 502 may be movable so that the height of the second electrode 502 can be controlled and thus the interval between the first electrode 501 and the second electrode 502 can be changed as appropriate.

An exhaust unit 509 that is connected to the reaction chamber 500 has a function of controlling the pressure in the reaction chamber 500 so as to retain a given pressure when the reaction chamber 500 is evacuated or supplied with a reaction gas.

The exhaust unit 509 includes a butterfly valve 517, a conductance valve 518, a turbo-molecular pump 519, a dry pump 520, and the like. In a case where the butterfly valve 517 and the conductance valve 518 are disposed in parallel, the butterfly valve 517 is closed and the conductance valve 518 is operated, whereby the exhaust velocity of a reaction gas is controlled and thus the pressure in the reaction chamber 500 can be kept in a given range. Further, when the butterfly valve 517 with large conductance is opened, high-vacuum evacuation can be carried out.

When an ultrahigh vacuum evacuation to a pressure lower than $10^{-5}$ Pa is carried out, a cryopump 521 is preferably used in combination with the above pumps. An ultrahigh vacuum evacuation of the reaction chamber 500 before forming the microcrystalline semiconductor layer 123 is effective in making an oxygen concentration in the microcrystalline semiconductor layer 123 less than or equal to $1 \times 10^{17}$ atoms/cm$^3$. Further, it is effective to process an inner wall of the reaction chamber 500 to form a mirror surface and to provide a heater for baking in order to reduce the amount of gas released from the inner wall, in attaining the degree of ultrahigh vacuum.

For high-frequency electric power supplied from the first high-frequency electric power source 504, a high-frequency wave with a wavelength of greater than or equal to 10 m approximately is used. High-frequency electric power with a frequency of from 3 to 30 MHz, which is in an HF band, (typically of 13.56 MHz) is supplied from the first high-frequency electric power source 504.

A frequency of high-frequency electric power supplied from the second high-frequency electric power source 505 lies in a VHF band, and a wavelength thereof is less than 10 m approximately. Specifically, high-frequency electric power with a wavelength of 30 to 300 MHz is supplied from the second high-frequency electric power source 505.

That is to say, the wavelength of a high-frequency wave supplied from the first high-frequency electric power source 504 is three or more times as large as the length of one side of the first electrode 501. The high-frequency wave supplied from the second high-frequency electric power source 505 has a smaller wavelength than that from the first high-frequency electric power source 504. High-frequency electric power which does not cause a surface standing wave is supplied to the first electrode 501 to generate plasma and at the same time high-frequency electric power in a VHF band is supplied to make the plasma have a higher density, whereby the microcrystalline semiconductor layer 123 with high crystallinity can be formed. Further, a thin film with excellent quality can be formed with a uniform thickness over a substrate having a large area with a long side of more than 2000 mm.

A process gas is excited by applying first high-frequency electric power and second high-frequency electric power, which have different frequencies, to the first electrode 501 so as to be superposed on each other. A frequency of the first high-frequency electric power is from 3 to 30 MHz, typically 13.56 MHz. A frequency of the second high-frequency electric power lies in a VHF band, which is higher than 30 MHz and lower than or equal to 300 MHz approximately. The process gas is excited with the first high-frequency electric power in a frequency band in which a surface standing wave is not caused to generate plasma, and at the same time, the second high-frequency electric power in a VHF band is also supplied to the process gas, whereby the plasma can have a higher density. Further, influence by a surface standing wave can be suppressed, and thus a thin film with excellent quality can be formed with a uniform thickness over a substrate having a large area with a long side of more than 2000 mm.

Helium can be mixed in the process gas as well. Helium has an ionized energy of 24.5 eV, which is the highest among all the gases, and a metastable state thereof lies in a level of 20 eV approximately, which is a little lower than the above ionized energy; thus, to be ionized, helium requires as low as 4 eV, which is the difference between the ionized energy and the metastable energy, for electric discharge duration. Therefore, helium starts to discharge electricity at the lowest voltage among all the gases. Plasma can be retained stably by mixing helium in the process gas because of the above property. Accordingly, uniform plasma can be formed, and thus a plasma density can be uniform even when a microcrystalline silicon film is deposited over a larger substrate.

Before forming the microcrystalline semiconductor layer 123, it is preferable that a surface of the insulating layer 102, over which the microcrystalline semiconductor layer 123 is formed, undergo plasma treatment. In this plasma treatment, rare gas plasma treatment, hydrogen plasma treatment, or a combination of rare gas treatment and hydrogen plasma treatment is preferably used.

In the rare gas plasma treatment, a rare gas element with large mass, such as argon, krypton, or xenon, is preferably used in order to remove oxygen, moisture, an organic matter, a metal element, and the like which are attached to a surface of the insulating layer 102, by an effect of sputtering. The hydrogen plasma treatment is effective in cleaning the surface of the insulating layer 102 over which the microcrystalline semiconductor layer 123 is formed, by the removal of the impurities attached to the surface of the insulating layer 102 and etching action on the insulating layer 102 by hydrogen radicals. The combination of the rare gas plasma treatment and the hydrogen plasma treatment can have an effect of promoting generation of a microcrystalline nucleus. Further, it is effective to successively supply a rare gas such as argon, together with a silicon source gas, to the reaction chamber 500 at an early stage of forming the microcrystalline silicon film in order to promote generation of a microcrystalline nucleus.

The amorphous semiconductor layer 124 can be formed by a CVD method such as a PECVD method, or a PVD method such as a sputtering method. If an amorphous silicon film is formed by a CVD method, one kind or plural kinds of gases selected from $SiH_4$, $Si_2H_6$, $SiH_2Cl_2$, $SiHCl_3$, $SiCl_4$, $SiF_4$, and the like can be used for a silicon source gas. For example, if $SiF_4$ is used, a mixed gas of $SiF_4$ and $SiH_4$ is preferably used as a silicon source gas. In addition to the silicon source gas and hydrogen, helium, argon, krypton, or neon can be mixed in a process gas used in a CVD method. Furthermore, if a gas including a halogen element (e.g., $F_2$, $Cl_2$, $Br_2$, $I_2$, HF, HCl, HBr, or HI) is mixed in a process gas, or if a silicon source gas including halogen (e.g., $SiH_2Cl_2$, $SiHCl_3$, $SiCl_4$, or $SiF_4$) is used, halogen can be added to the amorphous silicon film.

If an amorphous silicon film is formed by a sputtering method, single-crystalline silicon, which is a target, is sputtered with a rare gas to form the amorphous silicon film. Further, if ammonia, nitrogen, or $N_2O$ is included in the atmosphere in forming the film, an amorphous silicon film including nitrogen can be formed. If a gas including halogen (e.g., $F_2$, $Cl_2$, $Br_2$, $I_2$, HF, HCl, HBr, or HI) is included in the atmosphere, an amorphous semiconductor film including fluorine, chlorine, bromine, or iodine can be formed.

Further, after forming the amorphous semiconductor layer 124, a surface of the amorphous semiconductor layer 124 may undergo treatment with hydrogen plasma, nitrogen plasma, or halogen plasma to be hydrogenated, nitrided, or halogenated. Alternatively, the surface of the amorphous semiconductor layer 124 may undergo treatment with rare gas plasma such as helium plasma, neon plasma, argon plasma, or krypton plasma.

The semiconductor layer 125, to which an impurity element imparting one conductivity type is added, constitutes the source region and the drain region, and is formed of a microcrystalline semiconductor or an amorphous semiconductor. The semiconductor layer 125 can be formed in a similar manner to the microcrystalline semiconductor layer 123 or the amorphous semiconductor layer 124, and a donor impurity element or an acceptor impurity element is added to the semiconductor layer 125 in forming the semiconductor layer 125. The semiconductor layer 125 is formed with a thickness of from 2 to 50 nm inclusive.

In order to form an n-channel TFT, phosphorus is added as a dopant impurity element to the semiconductor layer 125, whereby the semiconductor layer 125 assumes n-type conductivity. Thus, if the semiconductor layer 125 is formed by a CVD method, a dopant gas including a donor element, such as $PH_3$, is mixed in a process gas. In order to form a p-channel TFT, boron is added as an acceptor impurity element to the semiconductor layer 125, whereby the semiconductor layer 125 assumes p-type conductivity. Thus, if the semiconductor layer 125 is formed by a CVD method, a dopant gas including an acceptor element such as $B_2H_6$, $BF_3$, $BCl_3$, $BBr_3$, or TMB is mixed in a process gas. The semiconductor layer 125 has a thickness of from 2 to 50 nm inclusive. The semiconductor film to which the impurity element imparting one conductivity type is added has a small thickness, thereby improving the throughput.

Next, a mask 131 is formed over the semiconductor layer 125. The mask 131 is formed by a photolithography technique or an inkjet method. The semiconductor layer 125, the amorphous semiconductor layer 124, and the microcrystalline semiconductor layer 123 are etched using the mask 131, thereby forming a third semiconductor layer 105, the second semiconductor layer 104, and the first semiconductor layer 103 (see FIG. 3C). In other words, an island-shaped stacked body with a three-layer structure of the third semiconductor layer 105, the second semiconductor layer 104, and the first semiconductor layer 103 is formed over the insulating layer 102 through the etching process.

Figure 3B:
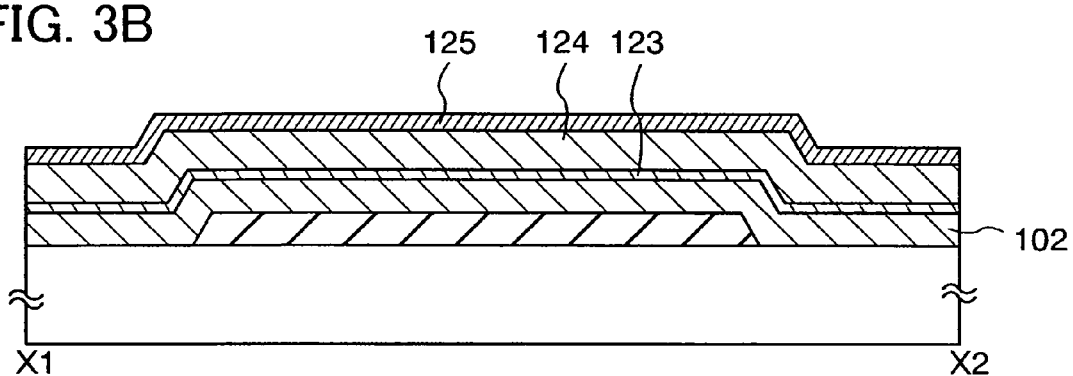
Figure 3C:
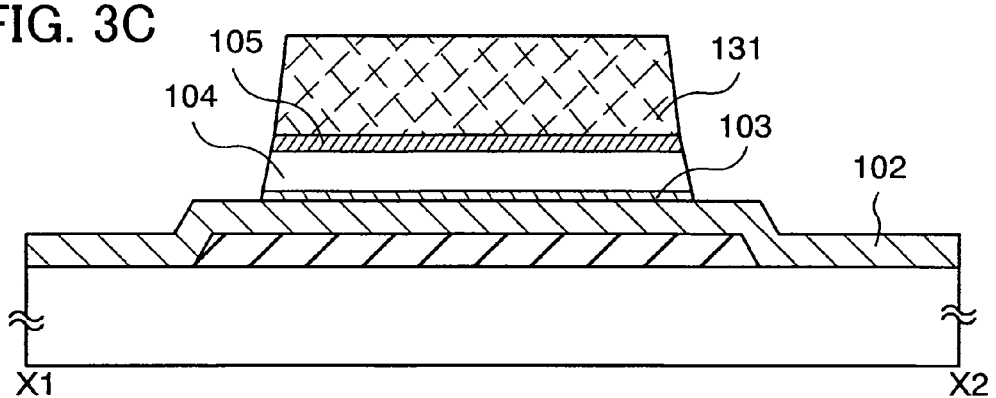

In a step shown in FIG. 3C, the third semiconductor layer 105 is not separated into the source region and the drain region. An entire portion of the second semiconductor layer 104 and an entire portion of the first semiconductor layer 103 overlap with the first conductive layer 101. With this structure, the first conductive layer 101 blocks light which has passed through the substrate 100, thereby preventing the second semiconductor layer 104 and the first semiconductor layer 103 from being irradiated with this light. Consequently, generation of light leakage current can be prevented.

Figure 3D:
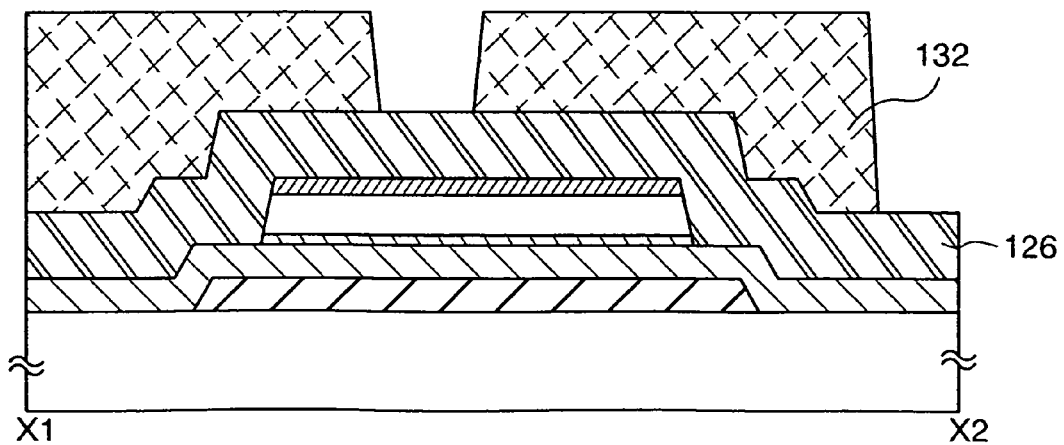

Next, a conductive layer 126 is formed over the third semiconductor layer 105 and the insulating layer 102, which remain after the etching, and a mask 132 is formed over the conductive layer 126 (see FIG. 3D). The mask 132 is formed by a photolithography technique or an inkjet method.

The conductive layer 126 can have a single-layer structure or a stacked-layer structure. It is preferable to form at least one conductive film of aluminum, an aluminum alloy, or copper in order to lower the resistance of the source electrode and the drain electrode. Preferably, a slight amount of titanium, neodymium, scandium, molybdenum, or the like is added to the aluminum to improve the heat resistance. Further, an alloy of the above element and aluminum is preferably used for the aluminum alloy to improve the heat resistance. A conductive film constituting the conductive layer 126 can be formed by a sputtering method or a vacuum vapor deposition method.

If the conductive layer 126 has a two-layer structure, a lower layer is formed using a heat-resistant metal film or a heat-resistant metal nitride film, and an upper layer is formed using a film of aluminum, an aluminum alloy, or copper. The heat-resistant metal means a metal having a higher melting point (preferably higher than or equal to 800° C.) than aluminum, and examples thereof are titanium, tantalum, molybdenum, tungsten, and the like. If the conductive layer 126 has a three-layer structure, a middle layer is formed using a film of aluminum, an aluminum alloy, or copper, and upper and lower layers are formed using heat-resistant metal films or heat-resistant metal nitride films. In other words, in a case of the three-layer structure, a conductive film with low resistance, such as an aluminum film, is preferably sandwiched between conductive films with high heat resistance. A conductive film constituting the conductive layer 126 can be formed by a sputtering method or a vacuum vapor deposition method.

In a step shown in FIG. 3B, the conductive layer 126 can also be formed over the semiconductor layer 125.

Figure 4A:
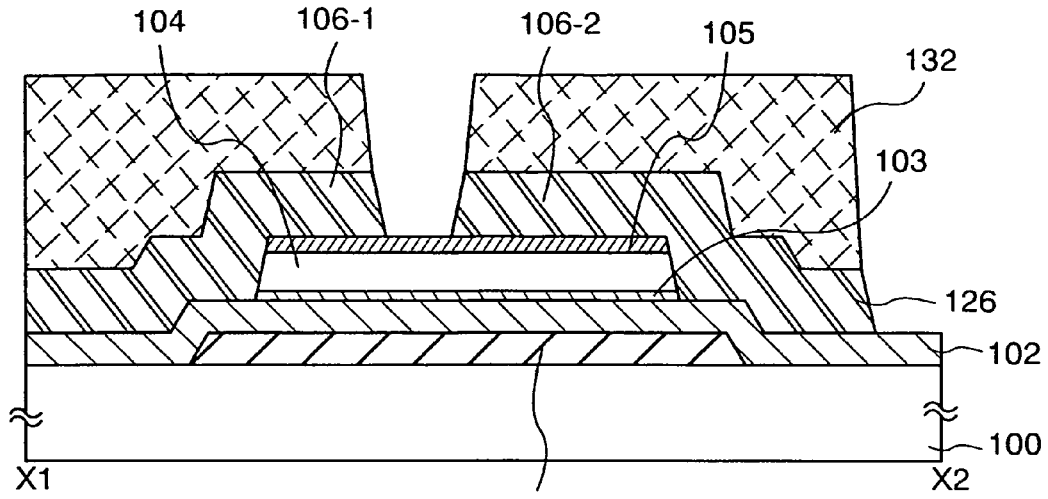
FIGS. 4A to 4C are cross-sectional views illustrating a method for manufacturing a thin film transistor.

Next, the conductive layer 126 is etched using the mask 132 to form the pair of second conductive layers 106-1 and 106-2 (see FIG. 4A).

Figure 4B:
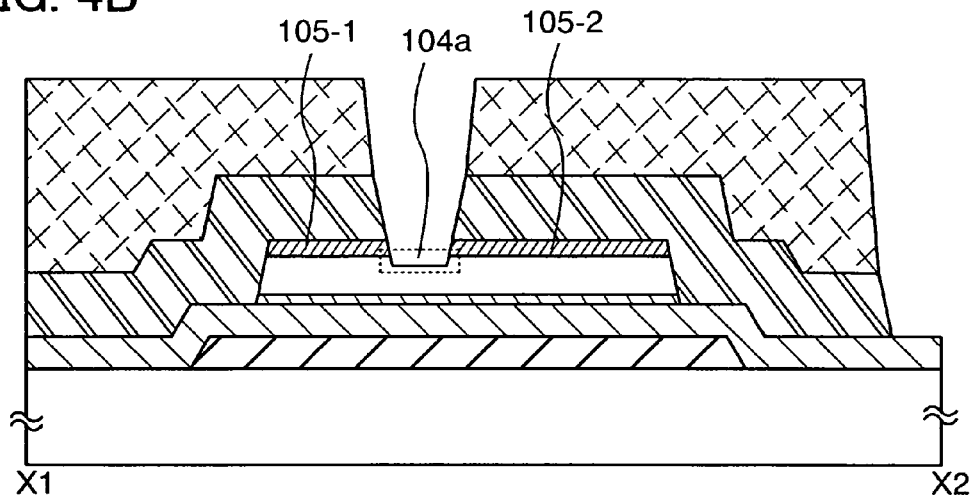

Further, the third semiconductor layer 105 is etched using the mask 132 to form the pair of third semiconductor layers 105-1 and 105-2 (see FIG. 4B). The second semiconductor layer 104 is also etched with an agent for etching the third semiconductor layer 105, thereby forming the recessed portion 104a. The recessed portion 104a is formed in a region where the second semiconductor layer 104 overlaps with neither the third semiconductor layers 105-1 nor 105-2, nor the pair of second conductive layers 106-1 nor 106-2. In a top view of FIG. 2, the second semiconductor layer 104 is exposed in this region. End portions of the third semiconductor layers 105-1 and 105-2 are almost aligned with those of the second conductive layers 106-1 and 106-2.

In order that the second semiconductor layer 104 can function as a buffer layer that prevents the first semiconductor layer 103 from being oxidized, the second semiconductor layer 104 needs to be etched so as not to expose the first semiconductor layer 103.

Figure 4C:
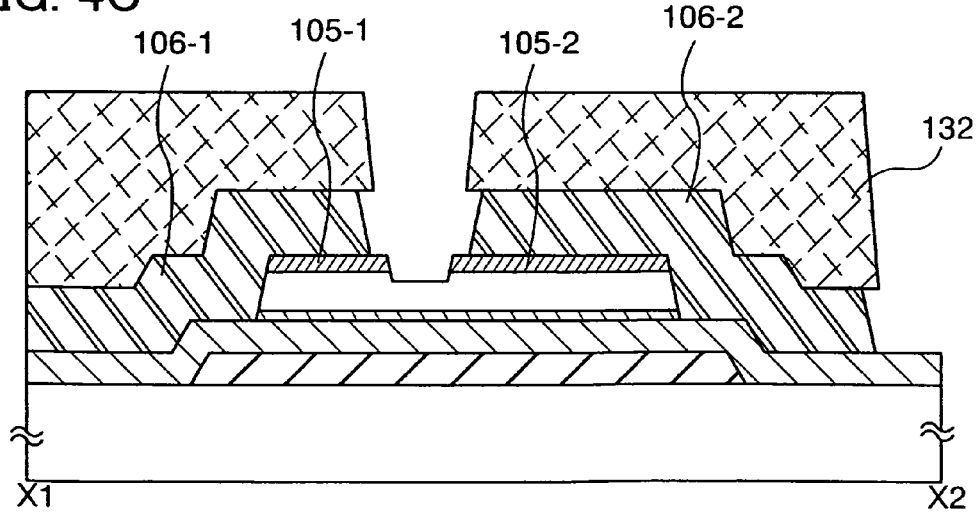

Then, peripheral portions of the second conductive layers 106-1 and 106-2 are etched (see FIG. 4C). Here, the second conductive layers 106-1 and 106-2 are wet-etched using the mask 132, whereby exposed portions of side surfaces of the second conductive layers 106-1 and 106-2 are etched away. Thus, a distance between the second conductive layers 106-1 and 106-2 can be larger than a channel length of the TFT. Accordingly, the distance between the second conductive layers 106-1 and 106-2 can be large, thereby preventing short circuit between the second conductive layers 106-1 and 106-2.

The etching treatment shown in FIG. 4C makes the end portions of the second conductive layers 106-1 and 106-2 out of alignment with those of the third semiconductor layers 105-1 and 105-2. In other words, the end portions of the third semiconductor layers 105-1 and 105-2 are located at outer side than those of the second conductive layers 106-1 and 106-2 as shown in FIG. 2. Such a structure prevents an electric field from being concentrated on the end portions of the source electrode, the drain electrode, the source region, and the drain region of the TFT, thereby preventing leakage current between the gate electrode and the source and drain electrodes. Thus, a thin film transistor with high reliability and high dielectric strength voltage can be manufactured.

After that, the mask 132 is removed. The end portions of the third semiconductor layers 105-1 and 105-2 can be almost aligned with those of the second conductive layers 106-1 and 106-2 without performing the etching treatment shown in FIG. 4C. Next, the insulating layer 108 is formed (see FIG. 1). The insulating layer 108 can be formed in a similar manner to the insulating layer 102. The insulating layer 108 is provided to prevent contamination impurities such as organic substances, metals, or moisture in the atmosphere from entering, and is preferably a dense film such as a silicon nitride film. In the above manner, the channel-etched TFT shown in FIGS. 1 and 2 is completed.

This embodiment mode describes a method for forming the microcrystalline semiconductor layer 123 using the PECVD apparatus shown in FIG. 19; as well as the microcrystalline semiconductor layer 123, further, the insulating layer 102, the amorphous semiconductor layer 124, the semiconductor layer 125, and the insulating layer 108 can be formed using the PECVD apparatus shown in FIG. 19.

In the PECVD apparatus shown in FIG. 19, each thin film can be formed by changing reaction gases. As the semiconductor layer in this embodiment mode, an amorphous silicon film, an amorphous silicon germanium film, an amorphous silicon carbide film, a microcrystalline silicon germanium film, a microcrystalline silicon carbide film, or the like can be formed. As the insulating layer, a silicon oxide film, a silicon nitride film, a silicon oxynitride film, a silicon nitride oxide film, or the like can be formed. That is to say, in order to form the semiconductor layers and the insulating layers, a PECVD method can be used in which two kinds of high-frequency electric power with different frequencies are supplied to a process gas to excite the process gas. In this embodiment mode, accordingly, the insulating layer 102, the amorphous semiconductor layer 124, the semiconductor layer 125, and the insulating layer 108 can be formed by a PECVD method in a similar manner to the microcrystalline semiconductor layer 123.

Embodiment Mode 2

Figure 5:
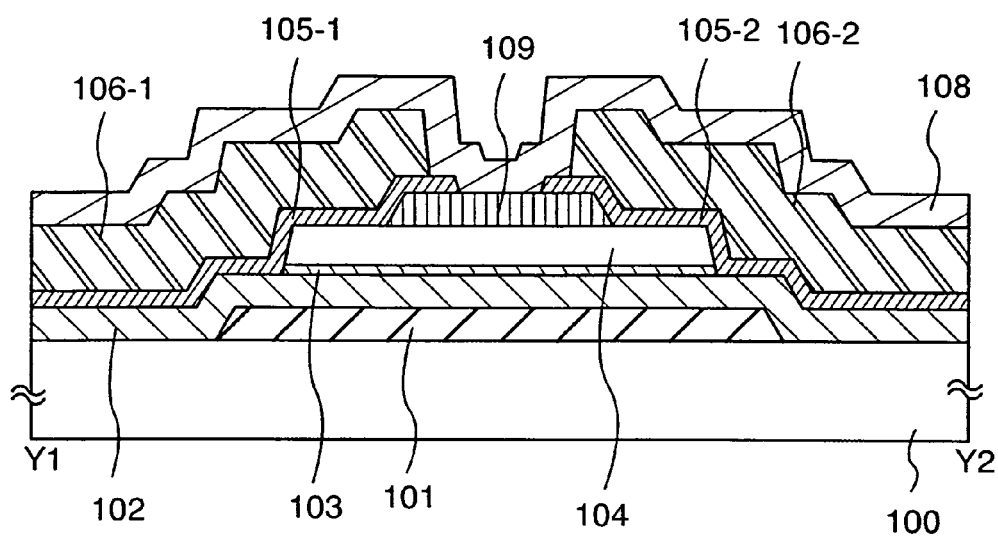
FIG. 5 is a cross-sectional view of a thin film transistor.
Figure 6:
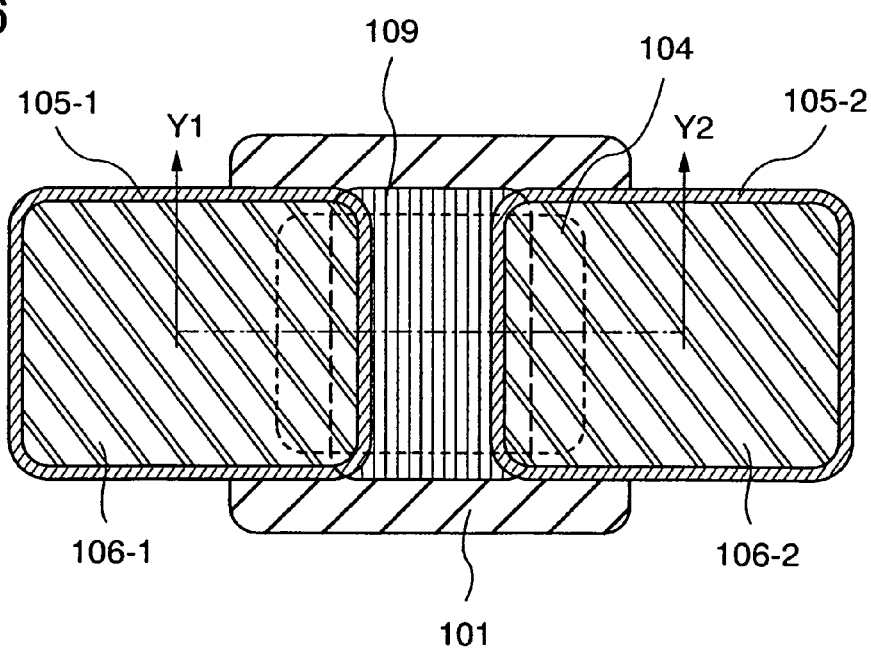
FIG. 6 is a top view of a thin film transistor.

This embodiment mode describes a thin film transistor with a different structure from Embodiment Mode 1, and a manufacturing method thereof. This embodiment mode describes a thin film transistor having a protective layer formed of an insulating film over a channel formation region, whereas Embodiment Mode 1 shows a channel-etched thin film transistor. Such a structure of a TFT having a protective layer is called a "channel-protective type." FIG. 5 is a cross-sectional view illustrating an example of a structure of a channel-protective TFT, and FIG. 6 is a top view thereof. FIG. 5 is a cross-sectional view taken along a line Y1-Y2 in FIG. 6.

The TFT in this embodiment mode is different from the TFT in Embodiment Mode 1 in the following point: the second semiconductor layer 104 is not provided with the recessed portion 104a but is provided with a protective layer 109 thereover; further, as shown in FIG. 6, the second semiconductor layer 104 is not exposed but is covered with the third semiconductor layers 105-1 and 105-2 and the protective layer 109; furthermore, an entire portion of the second conductive layers 106-1 and 106-2 overlaps with the third semiconductor layers 105-1 and 105-2. However, the TFT in this embodiment mode is similar to the TFT in Embodiment Mode 1 in that the end portions of the second conductive layers 106-1 and 106-2 are not aligned with those of the third semiconductor layers 105-1 and 105-2, and the entire portion of the first semiconductor layer 103 and the entire portion of the second semiconductor layer 104 overlaps with the first conductive layer 101.

Next, a method for manufacturing the TFT shown in FIGS. 5 and 6 is described with reference to FIGS. 7A to 7C and FIGS. 8A to 8C. The manufacturing method in Embodiment Mode 1 can be applied to the method for manufacturing the TFT in this embodiment mode.

First, the first conductive layer 101 is formed over a substrate 100, and then an insulating layer 102, a microcrystalline semiconductor layer 123, and an amorphous semiconductor layer 124 are stacked thereover. Further, the protective layer 109 is formed over the amorphous semiconductor layer 124 (see FIG. 7A). The protective layer 109 can be formed by etching an insulating layer that is formed in a similar manner to the insulating layer 102, or etching a non-photosensitive organic layer, to have an island shape.

Next, a similar mask (not illustrated) to that shown in FIG. 3C is formed over the protective layer 109 and the amorphous semiconductor layer 124. The amorphous semiconductor layer 124 and the microcrystalline semiconductor layer 123 are etched using the mask in a similar manner to FIG. 3C, so that the first semiconductor layer 103 and the second semiconductor layer 104 are formed (see FIG. 7B). After that, the mask is removed.

Subsequently, a semiconductor layer 125 and a conductive layer 126 are stacked in this order over the insulating layer 102, the second semiconductor layer 104, and the protective layer 109 (see FIG. 7C).

Then, a mask 133 is formed over the conductive layer 126. The conductive layer 126 is etched using the mask 133 in a similar manner to FIG. 4A, so that the pair of second conductive layers 106-1 and 106-2 are formed (see FIG. 8A).

Figure 8A:
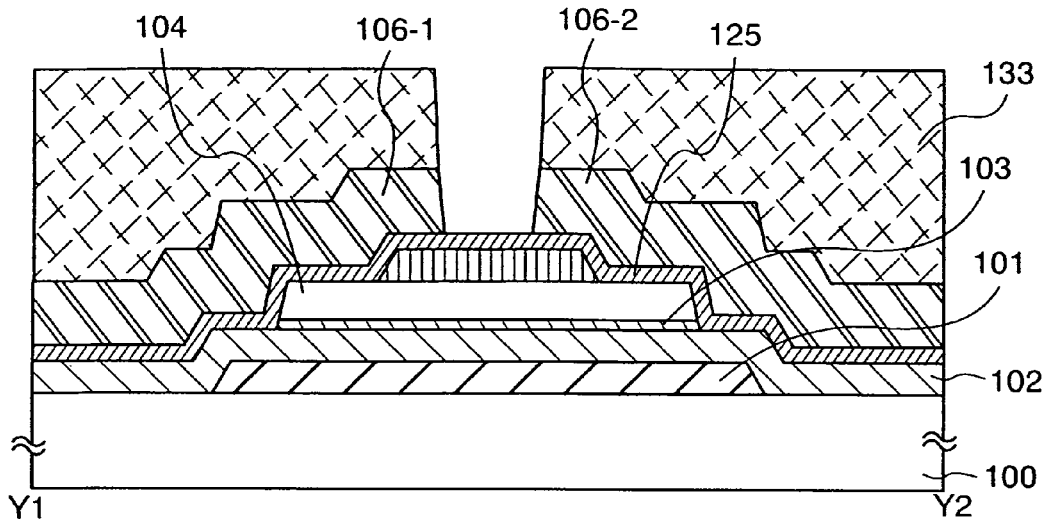
FIGS. 8A to 8C are cross-sectional views illustrating a method for manufacturing a thin film transistor.
Figure 8B:
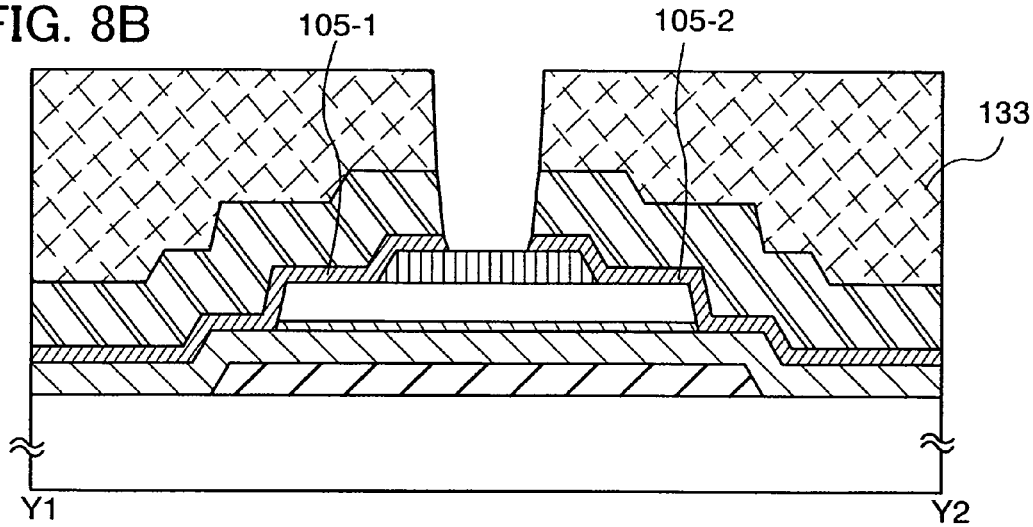

Further, the semiconductor layer 125 is etched using the mask 133 in a similar manner to FIG. 4B, so that the pair of third semiconductor layers 105-1 and 105-2 are formed (see FIG. 8B). In this etching process, a recessed portion is not formed in the second semiconductor layer 104 because the protective layer 109 functions as an etching stopper. The conductive layer 126 is stacked over the semiconductor layer 125, and the conductive layer 126 and the semiconductor layer 125 are etched using the common mask 133; therefore, the second conductive layers 106-1 and 106-2 are present in a region where the third semiconductor layers 105-1 and 105-2 are present. Further, the end portions of the third semiconductor layers 105-1 and 105-2 are almost aligned with those of the second conductive layers 106-1 and 106-2.

Figure 8C:
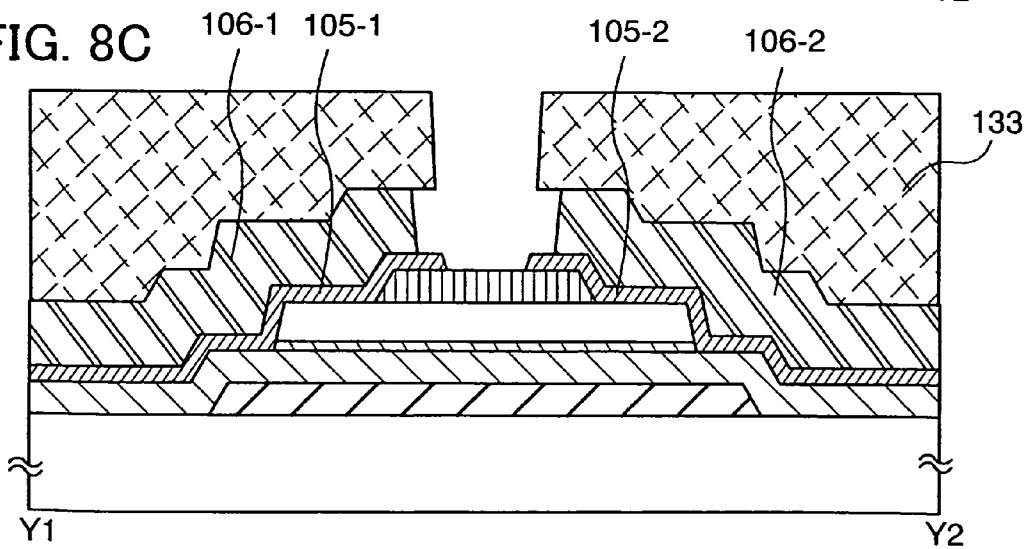

Next, peripheral portions of the second conductive layers 106-1 and 106-2 are etched away in a similar manner to FIG. 4C (see FIG. 8C). In this step, the end portions of the second conductive layers 106-1 and 106-2 come to be out of alignment with those of the third semiconductor layers 105-1 and 105-2. Specifically, the end portions of the third semiconductor layers 105-1 and 105-2 are located at outer side than those of the second conductive layers 106-1 and 106-2 as shown in FIG. 6. Such a structure prevents an electric field from being concentrated on the end portions of a source electrode, a drain electrode, a source region, and a drain region of the TFT, thereby preventing leakage current between the gate electrode and the source and drain electrodes. Thus, a thin film transistor with high reliability and high dielectric strength voltage can be manufactured.

After that, the mask 133 is removed. The end portions of the third semiconductor layers 105-1 and 105-2 can be almost aligned with those of the second conductive layers 106-1 and 106-2 without performing the etching treatment shown in FIG. 8C. Next, an insulating layer 108 is formed (see FIG. 5). In the above manner, the channel-protective TFT shown in FIGS. 5 and 6 can be completed.

Embodiment Mode 3

This embodiment mode describes an active matrix display device, which is an example of a semiconductor device including a transistor. An active matrix display device has a transistor in each pixel in a pixel portion.

Figure 9:
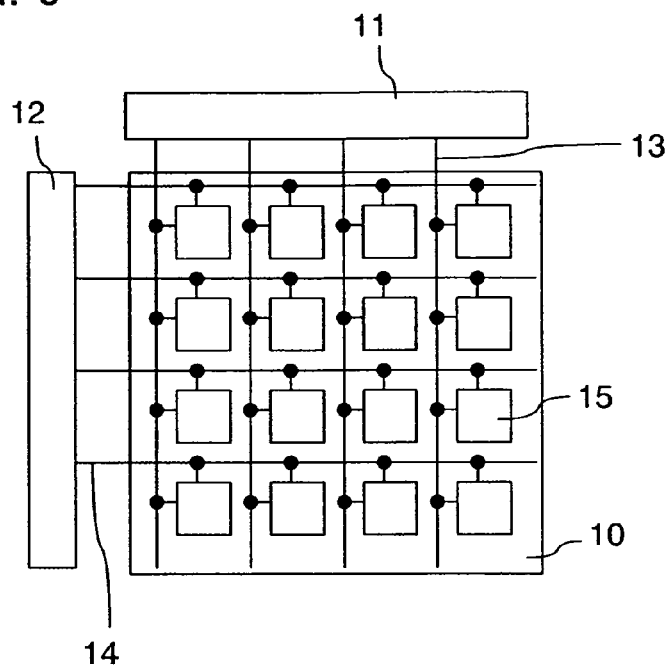
FIG. 9 is a block diagram illustrating a structure of an active matrix display device.

First, using drawings, a structure of an active matrix display device of the present invention is described. FIG. 9 is a block diagram of an example of a structure of the active matrix display device. The active matrix display device has a pixel portion 10, a source line driver circuit 11, a scanning line driver circuit 12, a plurality of source lines 13 that are connected to the source line driver circuit 11, and a plurality of scanning lines 14 that are connected to the scanning line driver circuit 12.

The plurality of source lines 13 are arranged in columns, and the plurality of scanning lines 14 are arranged in rows in intersection therewith. In the pixel portion 10, a plurality of pixels 15 are arranged in a row-column fashion corresponding to the rows and columns made by the source lines 13 and the scanning lines 14. A pixel 15 is connected to a source line 13 and a scanning line 14. The pixel 15 includes a switching element and a display element. The switching element controls whether a pixel is selected or not, based on signals input to the scanning line 14. The display element controls a gray scale based on signals input from the source line 13.

Figure 10:
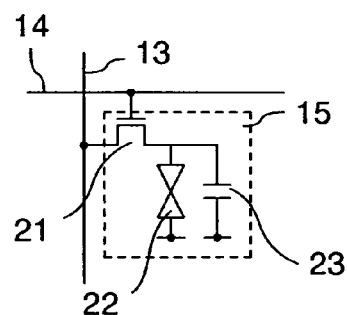
FIG. 10 is a circuit diagram of a pixel including a liquid crystal element.
Figure 11:
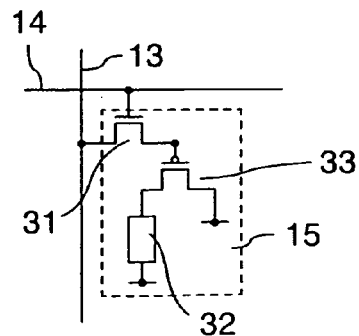
FIG. 11 is a circuit diagram of a pixel including a light-emitting element.

Using FIGS. 10 and 11, an example of the structure of the pixel 15 is described. An example of the structure of the pixel 15 when the present invention is applied to an active matrix liquid crystal display device is shown in FIG. 10. FIG. 10 is a circuit diagram of a pixel. The pixel 15 includes a switching transistor 21 for the switching element and a liquid crystal element 22 for the display element. A gate of the switching transistor 21 is connected to the scanning line 14, and either one of a source or drain of the switching transistor 21 is connected to the source line 13 while the other is connected to the liquid crystal element 22. The TFT in Embodiment Mode 1 or 2 is applied to the switching transistor 21.

The liquid crystal element 22 includes a pixel electrode, a counter electrode, and a liquid crystal. The orientation of the liquid crystal is controlled by the electric field produced by the pixel electrode and the counter electrode. The liquid crystal is injected between two substrates in the active matrix liquid crystal display device. An auxiliary capacitor 23 is a capacitor used to retain the potential of the pixel electrode of the liquid crystal element 22 and is connected to the pixel electrode of the liquid crystal element 22.

An example of the structure of the pixel 15 when the present invention is applied to an active matrix electroluminescent (EL) display device is shown in FIG. 11. FIG. 11 is a circuit diagram of a pixel. The pixel 15 includes a switching transistor 31 for the switching element and a light-emitting element 32 for the display element. Furthermore, the pixel 15 includes a driving transistor 33 whose gate is connected to the switching transistor 31. The light-emitting element 32 includes a pair of electrodes and a light-emitting layer including a light-emitting material, which is interposed between the pair of electrodes. The TFT in Embodiment Mode 1 or 2 is applied to the switching transistor 31 and the driving transistor 33.

Light-emitting elements utilizing electroluminescence are classified into two types according to whether the light-emitting material is an organic compound or an inorganic compound. In general, the former is referred to as an organic EL element and the latter is referred to as an inorganic EL element. Both an organic EL element and an inorganic EL element can be used for the light-emitting element 32.

In order to make an organic EL element emit light, a voltage is applied between the pair of electrodes. Thus, electrons are injected from an electrode into a light-emitting layer including a light-emitting organic compound, and holes are injected from the other electrode into the light-emitting layer including the light-emitting organic compound, and there flows electric current between the pair of electrodes. These carriers (electrons and holes) are recombined in the light-emitting layer, so that the light-emitting organic compound is placed in an excited state. The light-emitting organic compound emits light in returning to a ground state from the excited state. A light-emitting element having such light-emitting mechanism is called a light-emitting element of a current excitation type.

Inorganic EL elements are classified into dispersive inorganic EL elements and thin film inorganic EL elements, depending on the element structure. A dispersive inorganic EL element includes a light-emitting layer in which particles of a light-emitting material are dispersed in a binder. Light emission mechanism thereof is donor-acceptor recombination light emission, in which a donor level and an acceptor level are utilized. A thin film inorganic EL element has a stacked-layer structure in which a light-emitting layer is sandwiched between two dielectric layers, and the two dielectric layers sandwiching the light-emitting layer are further sandwiched between two electrodes. Light emission mechanism of the thin film inorganic EL element is local light emission, in which inner-shell electron transition of a metal ion is utilized.

Figure 12:
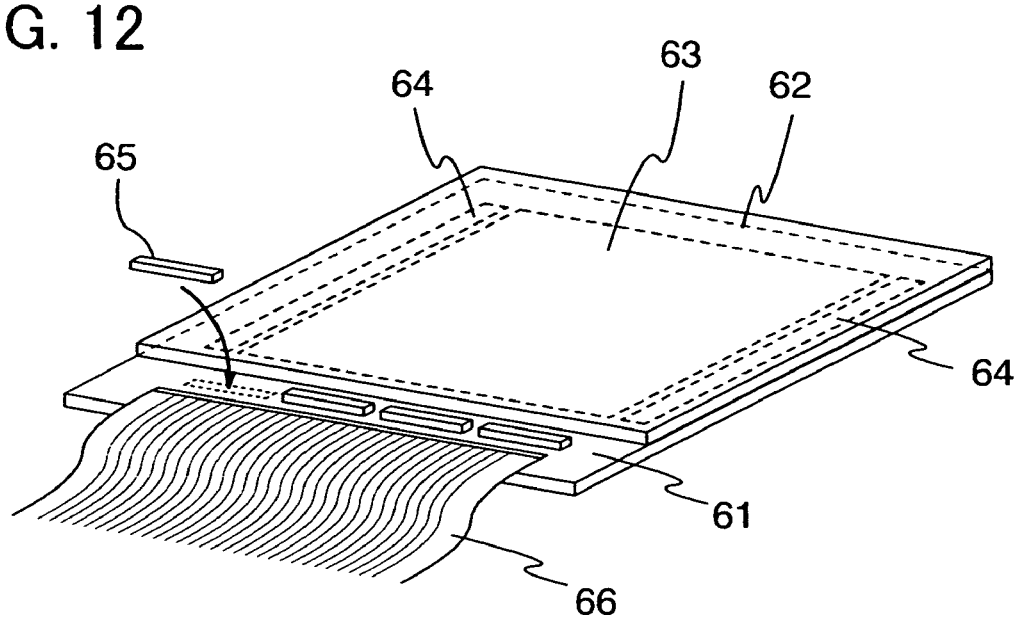
FIG. 12 is an external perspective view of a module of an active matrix display device.

An external perspective view of a module of an active matrix display device is shown in FIG. 12. The module includes two substrates 61 and 62. A pixel portion 63 and a scanning line driver circuit 64 are formed over the substrate 61, using thin film transistors including microcrystalline semiconductor films. A source line driver circuit is formed using an IC chip 65, and is mounted on the substrate 61. An external connecting terminal is provided for the substrate 61, and is connected to an FPC 66. The pixel portion 63, the source line driver circuit formed using the IC chip 65, and the scanning line driver circuit 64 are supplied with potential of a power source, various signals, and the like through the FPC 66.

The scanning line driver circuit 64 can also be formed using the IC chip 65. In a case where the source line driver circuit or the scanning line driver circuit 64 is formed using the IC chip 65, the IC chip 65 may be mounted on a different substrate from the substrates 61 and 62, and an external connecting terminal of this substrate may be connected to the external connecting terminal of the substrate 61 through an FPC or the like.

Figure 13:
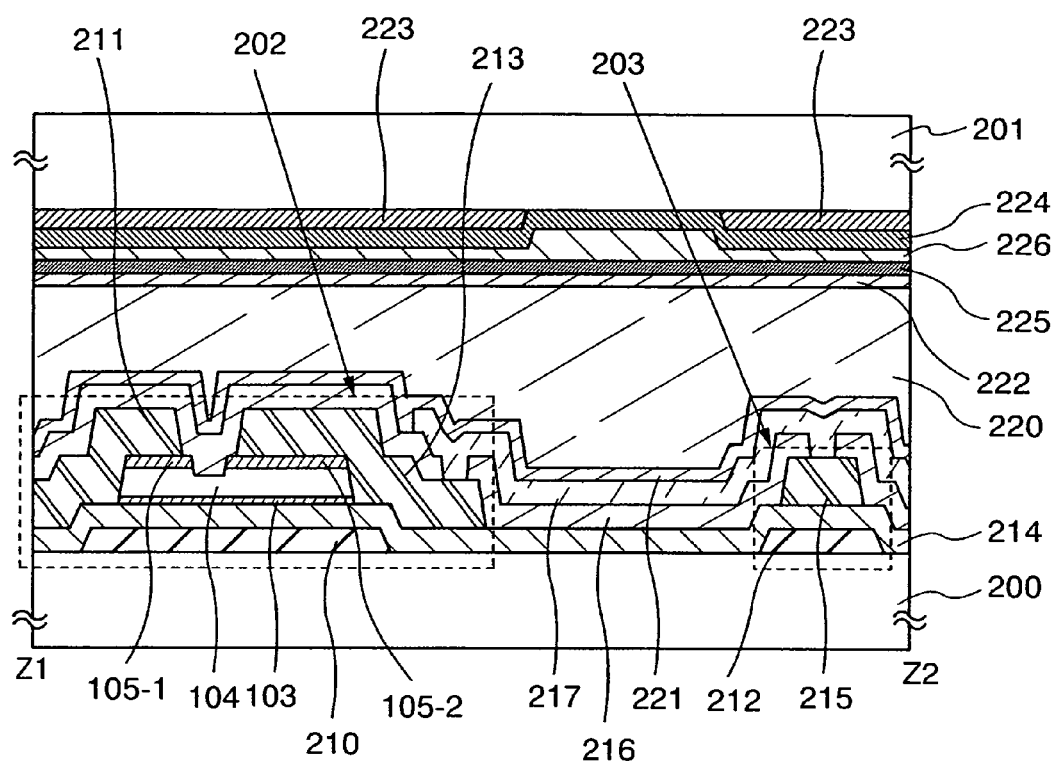
FIG. 13 is a cross-sectional view of a pixel including a liquid crystal element.

Next, a more detailed structure of an active matrix liquid crystal display device module is described. FIG. 13 is a cross-sectional view illustrating an example of a cross-sectional structure of a pixel. Here, a cross-sectional structure of a pixel portion of a liquid crystal display device which is driven in a TN mode is described. A pair of substrates 200 and 201 correspond to the substrates 61 and 62 shown in FIG. 12, respectively. A TFT 202 and an auxiliary capacitor 203 are provided for the substrate 200. The TFT 202 and the auxiliary capacitor 203 correspond to the switching transistor 21 and the auxiliary capacitor 23 shown in FIG. 10, respectively.

Figure 14:
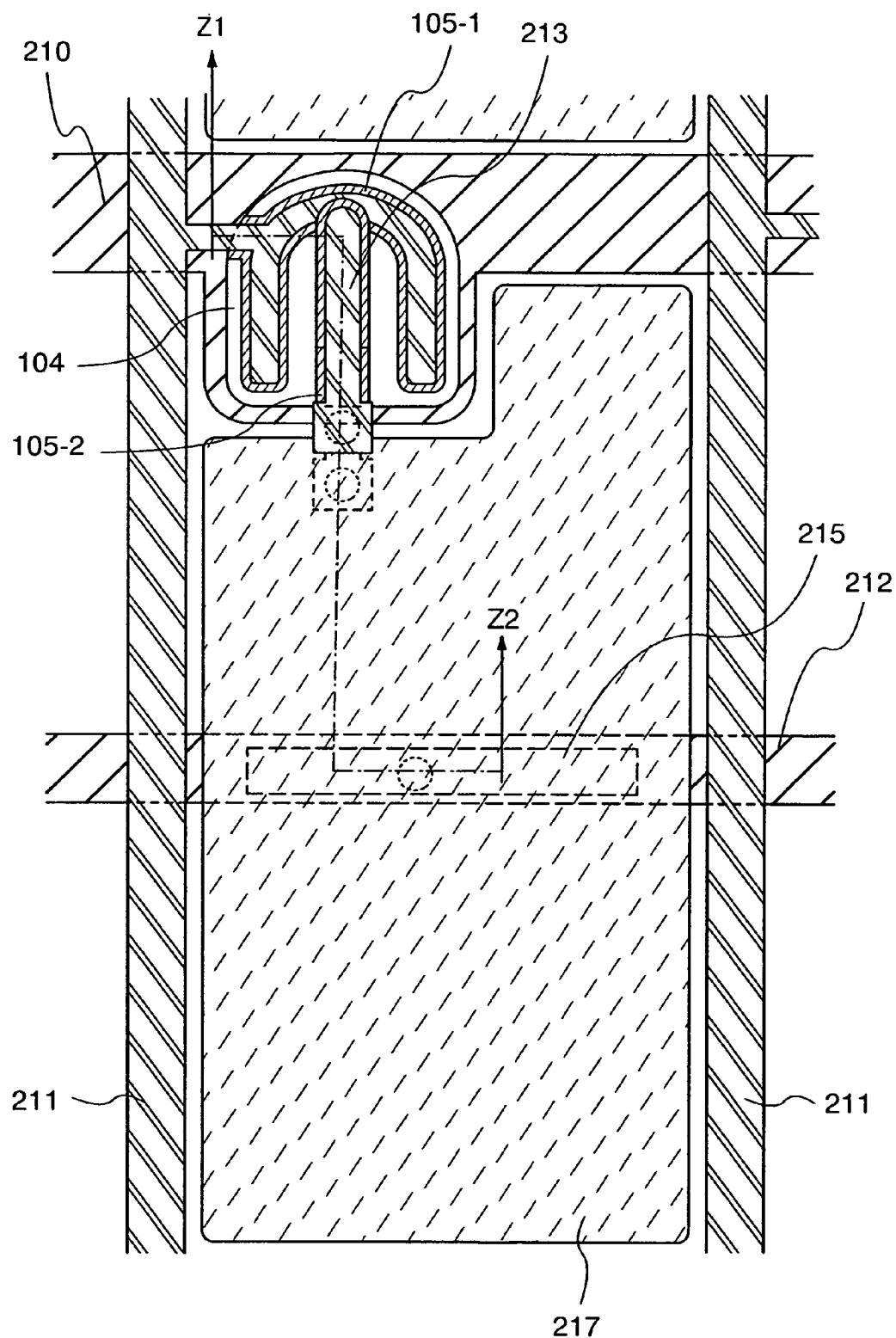
FIG. 14 is a top view of a pixel.

FIG. 14 is a top view of a pixel on the substrate 200 side, and a cross-sectional structure thereof taken along a line Z1-Z2 in FIG. 14 is shown in FIG. 13. In this embodiment mode, a structure of the TFT 202 is the same as that of the TFT in Embodiment Mode 1; however, a structure of the TFT 202 can also be the same as that of the TFT in Embodiment Mode 2. A scanning line 210, a source line 211, and an auxiliary capacitor line 212 are formed in the pixel. A first conductive layer (a gate electrode) of the TFT 202 is formed as a part of the scanning line 210. The auxiliary capacitor line 212 is formed at the same time as the scanning line 210. Either one of second conductive layers (a source electrode or a drain electrode) of the TFT 202 is formed as a part of the source line 211. Further, the other of the second conductive layers (the source electrode or the drain electrode), which forms a pair with the source line 211, is an electrode 213.

An insulating layer 214 over the scanning line 210 and the auxiliary capacitor line 212 functions as a gate insulating layer of the TFT 202. An electrode 215 is formed over the auxiliary capacitor line 212 with the insulating layer 214 interposed therebetween. The auxiliary capacitor 203, in which the insulating layer 214 functions as a dielectric, and the auxiliary capacitor line 212 and the electrode 215 function as a pair of electrodes, is formed in a portion where the auxiliary capacitor line 212 and the electrode 215 overlap with each other. The electrode 215 is formed at the same time as the second conductive layer of the TFT 202. That is to say, the source line 211 and the electrodes 213 and 215 are formed at the same time.

An insulating layer 216 functions as a passivation layer, and is formed in a similar manner to the insulating layer 108 in Embodiment Modes 1 and 2. A contact hole is formed in the insulating layer 216 over the electrode 213, and a pixel electrode 217 is electrically connected to the electrode 213 through the contact hole. That is to say, the TFT 202 is electrically connected to the pixel electrode 217. Further, another contact hole is also formed in the insulating layer 216 over the electrode 215, and the pixel electrode 217 is electrically connected to the electrode 215 through the contact hole, so that the auxiliary capacitor 203 is electrically connected to the pixel electrode 217.

The pixel electrode 217 can transmit light when formed of a conductive material such as indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, or indium tin oxide to which silicon oxide is added.

Further, the pixel electrode 217 can be formed of a conductive layer including a conductive high molecule (also referred to as a conductive polymer). As a conductive high molecule, so-called a "π electron conjugated conductive high molecule" can be used. For example, polyaniline or a derivative thereof, polypyrrole or a derivative thereof, polythiophene or a derivative thereof, or a copolymer of two or more kinds of these materials can be given. It is preferable that a conductive layer which is used for the pixel electrode 217 and includes a conductive high molecule have sheet resistance of less than or equal to 10000 Ω/square, and light transmittance of greater than or equal to 70% at a wavelength of 550 nm. Further, it is preferable that a conductive high molecule have resistance of less than or equal to 0.1 Ω·cm.

A liquid crystal layer 220 is formed between the substrates 200 and 201. Orientation films 221 and 222 for orienting liquid crystal molecules included in the liquid crystal layer 220 are provided for surfaces of the substrates 200 and 201, respectively. In order to seal the liquid crystal layer 220 between the substrates 200 and 201, a sealant formed of a resin material is formed at a peripheral portion of the substrates 200 and 201. Further, spacer beads are dispersed in the liquid crystal layer 220 in order to maintain a distance between the substrates 200 and 201. Instead of the spacer beads, columnar spacers may be formed over the substrate 200 in a process of manufacturing the TFT 202. The columnar spacers can be formed using a photosensitive resin.

Further, the substrate 201 is provided with a light blocking film 223, a coloring film 224, a counter electrode 225, and the like. A portion in which the pixel electrode 217, the liquid crystal layer 220, and the counter electrode 225 are stacked functions as a liquid crystal element. The light blocking film 223 covers a region where orientation of liquid crystal molecules is easily disordered. For example, the light blocking film 223 covers a region where the TFT 202 is formed and a region where the auxiliary capacitor 203 is formed. The coloring film 224 functions as a color filter. In order to planarize unevenness which is caused by forming the light blocking film 223, a planarizing film 226 is formed between the coloring film 224 and the counter electrode 225, thereby preventing orientation disorder of the liquid crystals.

Although a structure of a pixel portion is described by taking the liquid crystal display device in the TN mode as an example here, a driving method of a liquid crystal display device is not limited to the TN mode. Typical driving methods other than the TN mode include a VA (vertical alignment) mode and a horizontal electric field mode. In the VA mode, liquid crystal molecules are oriented in a vertical direction with respect to a substrate when no voltage is applied to the liquid crystal molecules. In a horizontal electric field mode, orientation of liquid crystal molecules is changed by applying an electric field mainly in a horizontal direction with respect to a substrate, thereby expressing gray scales.

Figure 15:
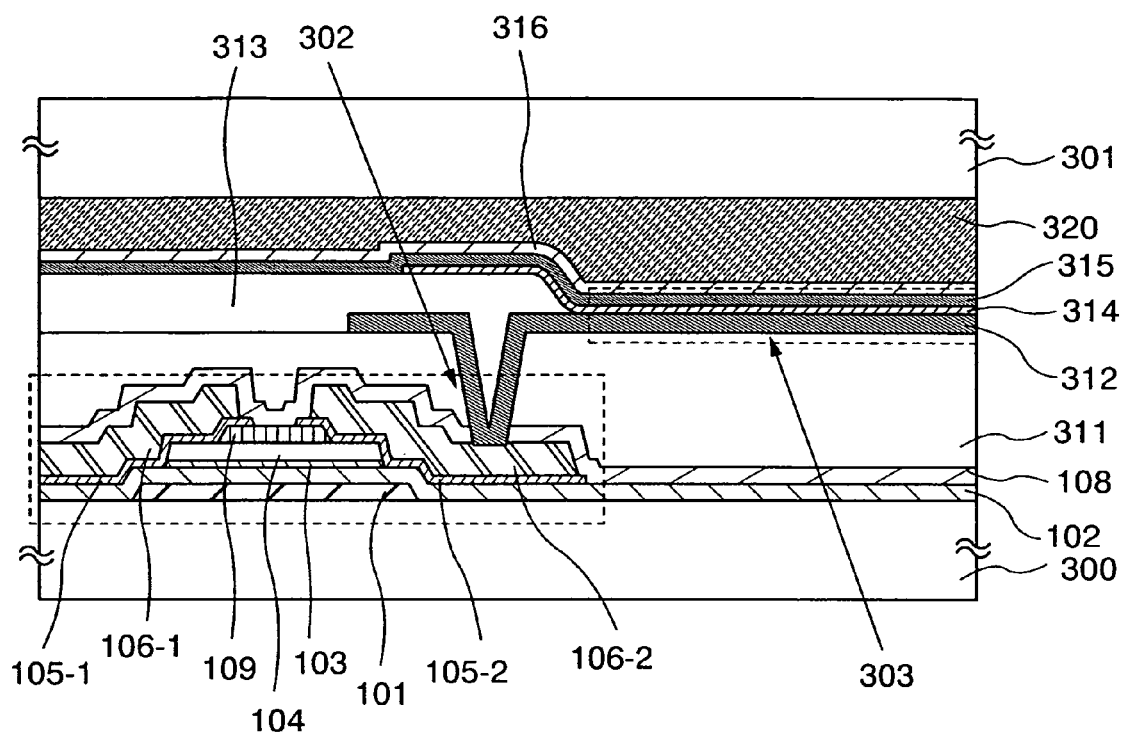
FIG. 15 is a cross-sectional view of a pixel.

Next, a more detailed structure of an active matrix EL display device module is described. FIG. 15 is a cross-sectional view for illustrating an example of a cross-sectional structure of a pixel portion. Here, a structure of a pixel portion is described by taking an example in which a light-emitting element is an organic EL element, and the TFT manufactured according to the method in Embodiment Mode 1 is used for a transistor formed in a pixel. In FIG. 15, a pair of substrates 300 and 301 correspond to the substrates 61 and 62 shown in FIG. 12, respectively. A TFT 302 and a light-emitting element 303 are provided for the substrate 300. The TFT 302 and the light-emitting element 303 correspond to the driving transistor 33 and the light-emitting element 32 shown in FIG. 10, respectively.

Through the steps described using FIGS. 3A to 3D and 4A to 4C, the TFT 302 and the insulating layer 108 for functioning as a protective film are formed over the substrate 300 (see FIG. 15). Next, a planarizing film 311 is formed over the insulating layer 108. It is preferable to form the planarizing film 311 using an organic resin such as acrylic, polyimide, or polyamide, or siloxane.

Next, a contact hole is formed in the planarizing film 311 in a portion overlapping with the second conductive layer 106-2 (the source electrode or the drain electrode). A pixel electrode 312 is formed over the planarizing film 311. The pixel electrode 312 is connected to the second conductive layer 106-2 of the TFT 302. If the TFT 302 is an n-channel TFT, the pixel electrode 312 functions as a cathode. If the TFT 302 is a p-channel TFT, the pixel electrode 312 functions as an anode. Therefore, a conductive film having a desired function is used for the pixel electrode 312. Specifically, in order to form a cathode, a material having a low work function, such as Ca, Al, CaF, MgAg, or AlLi, can be used. In order to form an anode, indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added, or the like can be used. A light-transmitting electrode can be formed using such a conductive material.

Next, a partition wall 313 is formed over the planarizing film 311. The partition wall 313 has an opening portion, and the pixel electrode 312 is exposed in the opening portion. Further, an end portion of the pixel electrode 312 is covered with the partition wall 313 around the opening portion. The partition wall 313 is formed using an organic resin film, an inorganic insulating film, or organic polysiloxane.

Next, a light-emitting layer 314 is provided for a surface of the substrate 300. The light-emitting layer 314 is formed to be in contact with the pixel electrode 312 in the opening portion of the partition wall 313. The light-emitting layer 314 can be formed with a single layer or a plurality of layers.

Subsequently, a common electrode 315 is formed so as to cover the light-emitting layer 314. The common electrode 315 can be formed in a similar manner to the pixel electrode 312. If the pixel electrode 312 is a cathode, the common electrode 315 is formed as an anode. The pixel electrode 312, the light-emitting layer 314, and the common electrode 315 are stacked in the opening portion of the partition wall 313, thereby forming the light-emitting element 303. After that, a protective film 316 is formed over the common electrode 315 and the partition wall 313 so that oxygen, hydrogen, moisture, carbon dioxide, or the like does not enter the light-emitting element 303. The protective film 316 can be formed using a silicon nitride film, a silicon nitride oxide film, a DLC (diamond-like carbon) film, or the like.

Next, the substrate 301 is attached to the surface of the substrate 300 using a resin layer 320. Such a structure can prevent the light-emitting element 303 from being exposed to outside air. A glass plate, a plastic plate, a resin film such as a polyester film or an acrylic film, or the like can be used for the substrate 301. Further, the resin layer 320 can be formed using an ultraviolet curable resin or a thermosetting resin. Examples of such resins include polyvinyl chloride (PVC), acrylic, polyimide, epoxy resin, silicone resin, polyvinyl butyral (PVB), ethylene vinyl acetate (EVA), and the like.

Embodiment Mode 4

This embodiment mode describes an electronic device in which an active matrix display device module is incorporated in a display portion, as an example of a semiconductor device of the present invention. The semiconductor device described in Embodiment Mode 3 can be applied to this module. As such electronic devices, video cameras, digital cameras, displays that can be mounted on a person's head (goggle-type displays), car navigation systems, projectors, car stereos, personal computers, portable information terminals (e.g., mobile computers, mobile phones, and electronic books), and the like can be given. Examples of these devices are illustrated in FIGS. 16A to 16C.

Figure 16A:
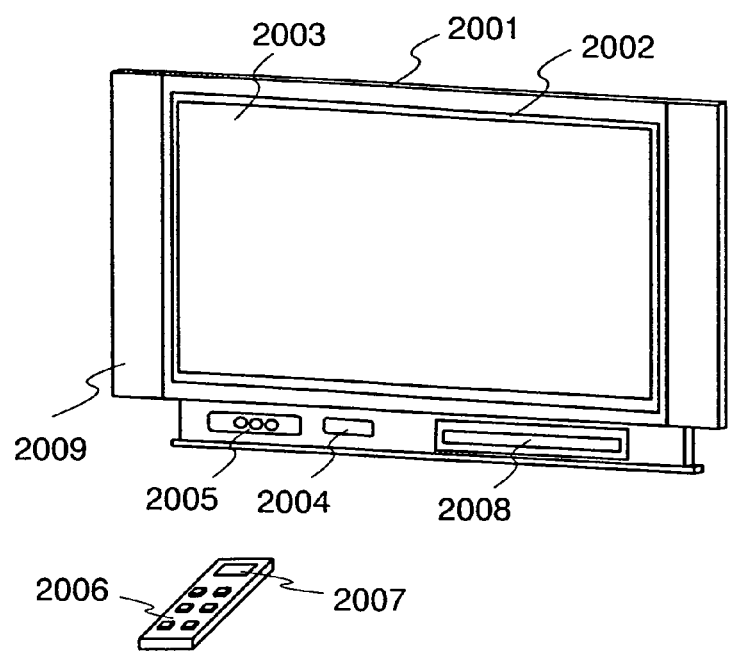
FIGS. 16A to 16C are external views of electronic devices provided with display modules.
Figure 16B:
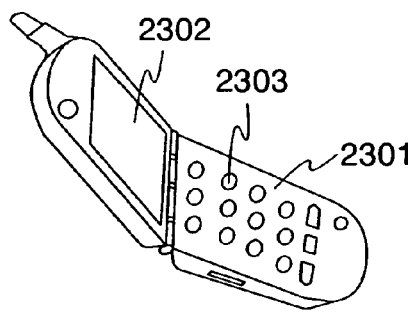
Figure 16C:
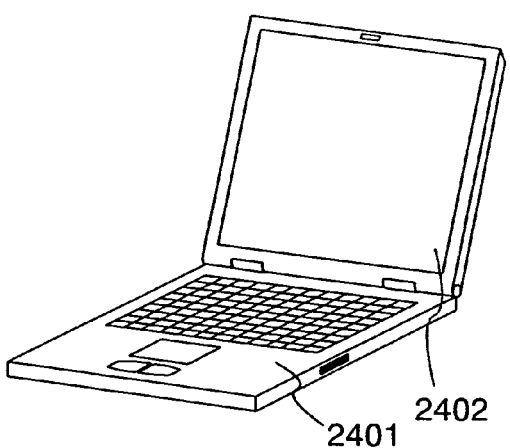

An external view of a television device is shown in FIG. 16A as an example of a semiconductor device of the present invention. A main screen 2003 is formed with the module. In addition, a speaker unit 2009, operation switches, and the like are provided as accessory equipment. A display module 2002 having a liquid crystal element or a light-emitting element in a pixel portion is incorporated in a chassis 2001. A receiver 2005 is a device for receiving television broadcast. A modem 2004 is a device for connecting the television device to a wired or wireless communication network. Connection to a communication network enables communication in two directions (from a viewer to a broadcaster, and from a broadcaster to a viewer) with the use of the television device. A remote control device 2006 or a switch which is incorporated in the chassis is used for operating the television device. Further, the television device can be provided with a subscreen 2008 as well as the main screen 2003, using the display module. The subscreen 2008 can be used as a screen for displaying channel number, volume, and the like. For example, the main screen 2003 can be formed using a module including a liquid crystal element, and the subscreen 2008 can be formed using a module including a light-emitting element, which enables display with low power consumption. Further, it is also possible that both the main screen 2003 and the subscreen 2008 are formed using a module including a light-emitting element.

Figure 17:
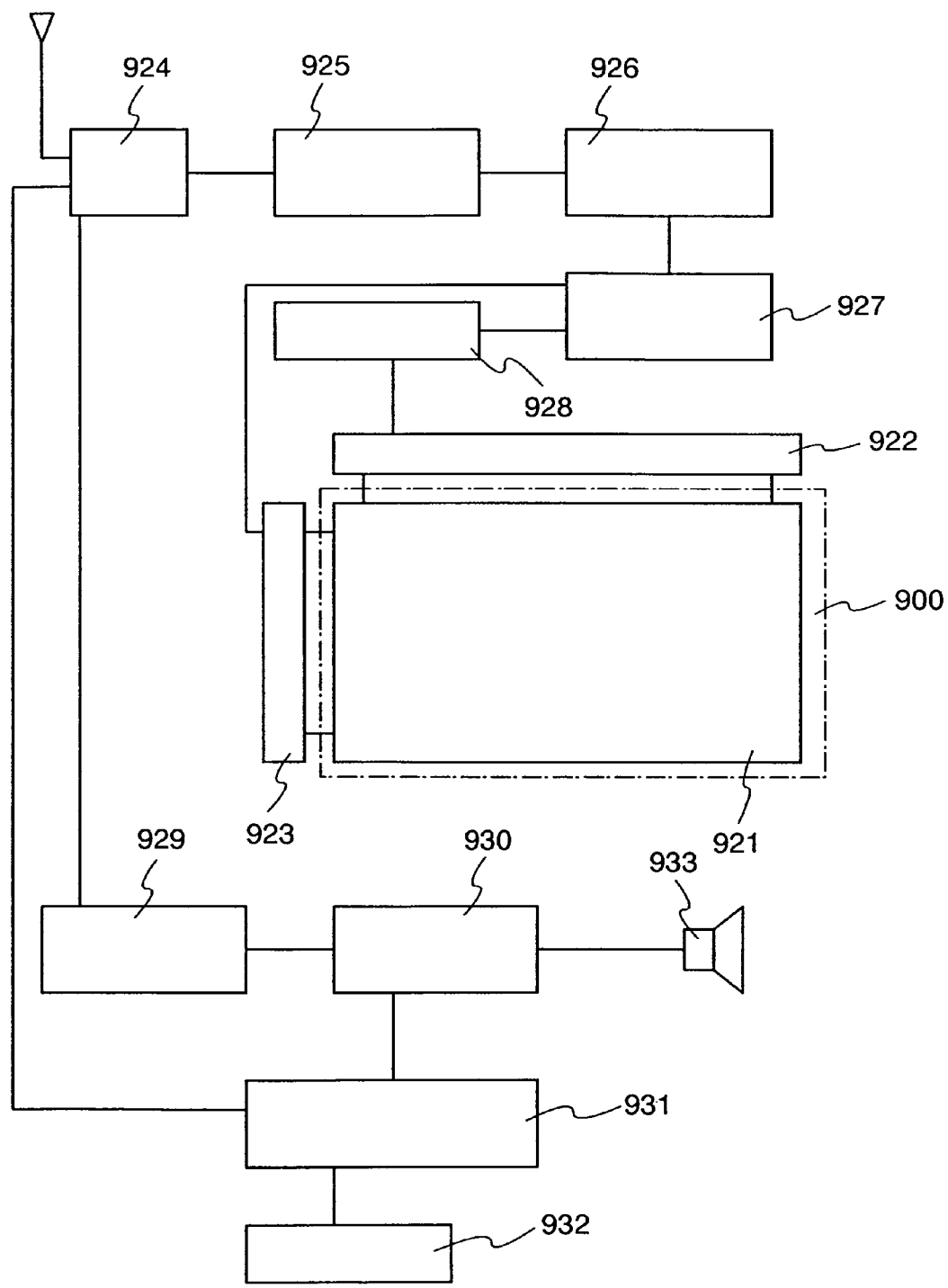
FIG. 17 is a block diagram illustrating a structure of a television device.

FIG. 17 is a block diagram showing a main structure of the television device. A pixel portion 921 is formed in a module 900 for display. A source line driver circuit 922 and a scanning line driver circuit 923 are mounted on the module 900 by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can match input specification of the driver IC, and the like are provided on an input side of the video signal. The control circuit 927 outputs signals to both a scanning line side and a source line side. In a case of digital driving, a signal divide circuit 928 may be provided on the source line side, and an input digital signal may be divided into m pieces and supplied to the source line driver circuit 922.

An audio signal among signals received by the tuner 924 is sent to an audio signal amplifier circuit 929 and is supplied to a speaker 933 through an audio signal process circuit 930. A control circuit 931 receives control information of a receiving station (reception frequency) or sound volume from an input portion 932 and transmits signals to the tuner 924 and the audio signal process circuit 930.

The present invention is not limited to a use for television devices, and can be applied to a variety of applications such as monitors of personal computers, information display boards in railway stations, airports, and the like, or street-side advertisement display boards.

FIG. 16B shows an external view of a mobile phone 2301 as an example of a semiconductor device of the present invention. The mobile phone 2301 includes a display portion 2302, an operation portion 2303, and the like. A module including a liquid crystal element or a light-emitting element is used for the display portion 2302.

FIG. 16C shows an external view of a portable computer as an example of a semiconductor device of the present invention. This portable computer includes a main body 2401, a display portion 2402, and the like. A module including a liquid crystal element or a light-emitting element is used for the display portion 2402.

Embodiment Mode 5

Figure 7A:
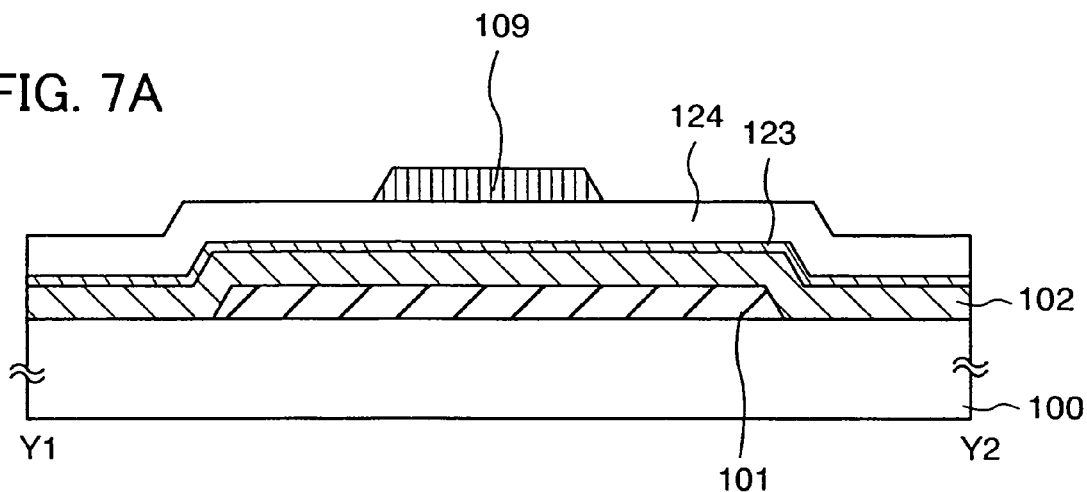
FIGS. 7A to 7C are cross-sectional views illustrating a method for manufacturing a thin film transistor.
Figure 7B:
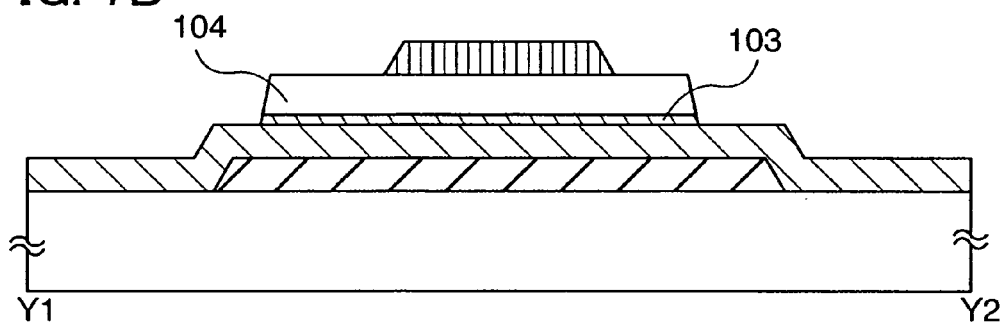
Figure 7C:
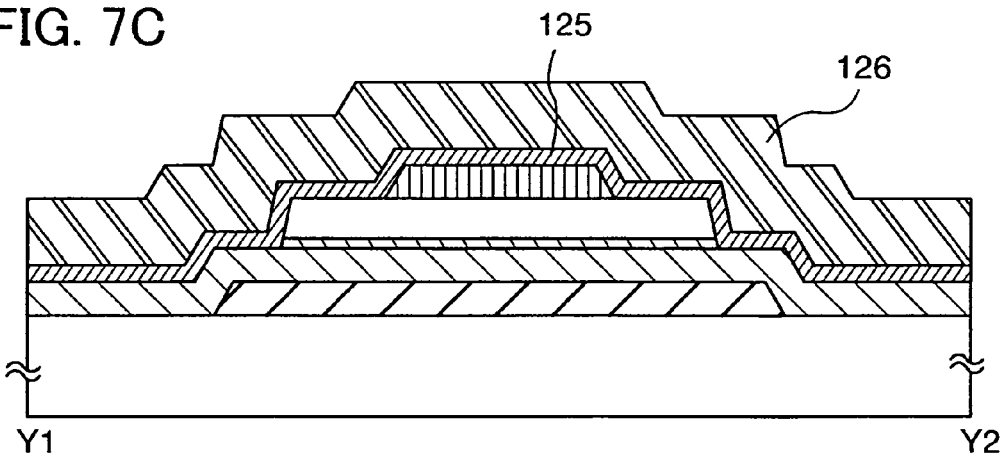

Embodiment Modes 1 and 2 describe processes of stacking the insulating layer 102, the microcrystalline semiconductor layer 123, the amorphous semiconductor layer 124, and the semiconductor layer 125 over the substrate 100 (see FIGS. 3A and 7A). These layers are preferably stacked without exposing the substrate 100 to the atmosphere. This embodiment mode describes a structure and a usage method of a PECVD apparatus for performing such a process.

Figure 18:
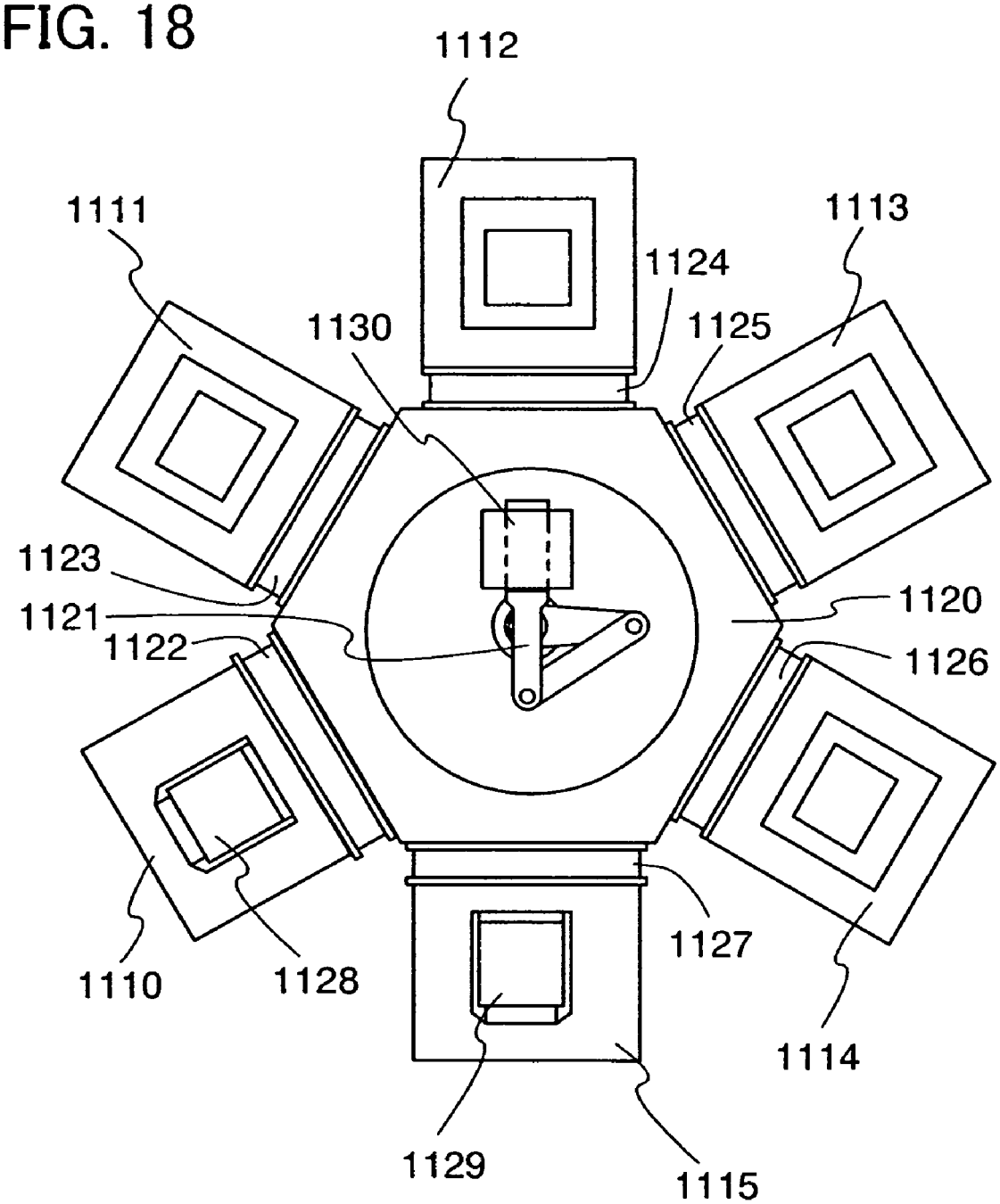
FIG. 18 is a cross-sectional view from above for illustrating a structure of a PECVD apparatus.

A PECVD apparatus capable of successively depositing layers from the insulating layer 102 to the third semiconductor layer 105 to which an impurity element imparting one conductivity type is added is described with reference to FIG. 18. FIG. 18 is a schematic view showing a cross-sectional view from above of the PECVD apparatus. In the PECVD apparatus, a common chamber 1120 is provided around with a load chamber 1110, an unload chamber 1115, and four reaction chambers 1111 to 1114. Gate valves 1122 to 1127 are provided between the common chamber 1120 and reaction chambers so that treatment in each reaction chamber does not have influence on treatment in other chambers. Substrates 1130 are set in a cassette 1128 of the load chamber 1110 and a cassette 1129 of the unload chamber 1115, respectively, and transferred to the reaction chambers 1111 to 1114 by a transfer unit 1121 of the common chamber 1120. This apparatus can limit the kind of the film to be stacked to each reaction chamber, and a plurality of films can be formed successively without being exposed to the atmosphere.

It is preferable to limit each reaction chamber 1111 to 1114 to a given film to be formed therein. For example, the reaction chamber 1111 may be dedicated to forming the insulating layer 102; the reaction chamber 1112 may be dedicated to forming the microcrystalline semiconductor layer 123; the reaction chamber 1113 may be dedicated to forming the amorphous semiconductor layer 124; and the reaction chamber 1114 may be dedicated to forming the semiconductor layer 125. Thus, the insulating layer 102, the microcrystalline semiconductor layer 123, the amorphous semiconductor layer 124, and the semiconductor layer 125 can be formed at the same time. As a result, mass productivity can be enhanced. Further, even when some reaction chamber is being subjected to maintenance or cleaning, films can be formed in other reaction chambers and cycle time for a film formation process can be shortened. In addition, the layers can be formed without any contamination of the interface thereof with atmospheric components or impurity elements included in the atmosphere; thus, variations in electric characteristics of thin film transistors can be reduced.

The reaction chamber 500 of the PECVD apparatus shown in FIG. 19 is used for the reaction chamber 1112 for forming the microcrystalline semiconductor layer 123. The reaction chamber 500 shown in FIG. 19 can also be used for the other reaction chambers 1111, 1113, and 1114.

Although the PECVD apparatus shown in FIG. 18 is provided with the load chamber and the unload chamber separately, a load chamber and an unload chamber may be combined and a load/unload chamber may be provided. In addition, the PECVD apparatus may be provided with a spare chamber. By pre-heating the substrate in the spare chamber, it is possible to shorten heating time before formation of the film in each reaction chamber, so that the throughput can be improved.

This application is based on Japanese Patent Application serial No. 2007-213059 filed with Japan Patent Office on Aug. 17, 2007, the entire contents of which are hereby incorporated by reference.

What is claimed is:

1. A method for manufacturing a semiconductor device, comprising the steps of:
    forming a gate electrode over a substrate;
    forming a gate insulating layer over the gate electrode;
    forming a first semiconductor layer over the gate insulating layer, wherein the first semiconductor layer includes a microcrystalline semiconductor comprising an acceptor impurity element;
    forming a second semiconductor layer over the first semiconductor layer, wherein the second semiconductor layer includes an amorphous semiconductor;
    forming an n-type or p-type semiconductor layer over the second semiconductor layer;
    forming a conductive layer over the n-type or p-type semiconductor layer;
    performing a first etching of the conductive layer so that a pair of conductive layers are formed;
    performing a second etching of the n-type or p-type semiconductor layer; and
    performing a third etching of the pair of conductive layers after the step of performing the second etching,
    wherein the first semiconductor layer is formed by a plasma-enhanced chemical vapor deposition method using a process gas comprising at least a dopant gas comprising the acceptor impurity element,
    wherein the process gas is supplied with high-frequency electric power having frequencies more than or equal to 3 MHz from two or more power supply units to generate plasma, and
    wherein the frequencies include at least a first frequency and a second frequency which are different from each other.

2. A method for manufacturing a semiconductor device, comprising the steps of:
    forming a gate electrode over a substrate;
    forming a gate insulating layer over the gate electrode;
    forming a microcrystalline semiconductor layer comprising an acceptor impurity element over the gate insulating layer;
    forming an amorphous semiconductor layer over the microcrystalline semiconductor layer;
    forming an n-type or p-type semiconductor layer over the amorphous semiconductor layer;
    etching the microcrystalline semiconductor layer, the amorphous semiconductor layer, and the n-type or p-type semiconductor layer with use of a mask;
    forming a conductive layer over the n-type or p-type semiconductor layer;
    performing a first etching of the conductive layer so that a source electrode and a drain electrode are formed;
    performing a second etching of the n-type or p-type semiconductor layer so that a source region and a drain region are formed; and
    performing a third etching of peripheral portions of the source electrode and the drain electrode,
    wherein the microcrystalline semiconductor layer is formed by a plasma-enhanced chemical vapor deposition method using a process gas comprising at least a dopant gas comprising the acceptor impurity element,
    wherein the process gas is supplied with high-frequency electric power having frequencies more than or equal to 3 MHz from two or more power supply units to generate plasma, and
    wherein the frequencies include at least a first frequency and a second frequency which are different from each other.

3. The method for manufacturing a semiconductor device according to claim 1,
    wherein the second semiconductor layer is formed by a plasma-enhanced chemical vapor deposition method using a process gas,
    wherein the process gas for forming the second semiconductor layer is supplied with high-frequency electric power having frequencies from two or more power supply units, to generate plasma, and
    wherein the frequencies for forming the second semiconductor layer include at least a first frequency and a second frequency which are different from each other.

4. The method for manufacturing a semiconductor device according to claim 2,
    wherein the amorphous semiconductor layer is formed by a plasma-enhanced chemical vapor deposition method using a process gas,
    wherein the process gas for forming the amorphous semiconductor layer is supplied with high-frequency electric power having frequencies from two or more power supply units, to generate plasma, and
    wherein the frequencies for forming the amorphous semiconductor layer include at least a first frequency and a second frequency which are different from each other.

5. The method for manufacturing a semiconductor device according to claim 1,
    wherein the gate insulating layer is formed by a plasma-enhanced chemical vapor deposition method using a process gas,
    wherein the process gas for forming the gate insulating layer is supplied with high-frequency electric power having frequencies from two or more power supply units, to generate plasma, and
    wherein the frequencies for forming the gate insulating layer include at least a first frequency and a second frequency which are different from each other.

6. The method for manufacturing a semiconductor device according to claim 2,
wherein the gate insulating layer is formed by a plasma-enhanced chemical vapor deposition method using a process gas,
wherein the process gas for forming the gate insulating layer is supplied with high-frequency electric power having frequencies from two or more power supply units, to generate plasma, and
wherein the frequencies for forming the gate insulating layer include at least a first frequency and a second frequency which are different from each other.

7. The method for manufacturing a semiconductor device according to claim 1,
wherein the acceptor impurity element is boron, and
wherein the dopant gas is a gas selected from the group consisting of trimethylboron, $B_2H_6$, $BF_3$, $BCl_3$, and $BBr_3$.

8. The method for manufacturing a semiconductor device according to claim 2,
wherein the acceptor impurity element is boron, and
wherein the dopant gas is a gas selected from the group consisting of trimethylboron, $B_2H_6$, $BF_3$, $BCl_3$, and $BBr_3$.

9. The method for manufacturing a semiconductor device according to claim 1,
wherein the second semiconductor layer is exposed by the step of performing the second etching.

10. The method for manufacturing a semiconductor device according to claim 2,
wherein a portion of the amorphous semiconductor layer is etched when the second etching is performed.

11. The method for manufacturing a semiconductor device according to claim 1,
wherein the high-frequency electric power includes at least a first high-frequency electric power with a frequency of from 3 to 30 MHz and a second high-frequency electric power with a frequency of from 30 to 300 MHz.

12. The method for manufacturing a semiconductor device according to claim 2,
wherein the high-frequency electric power includes at least a first high-frequency electric power with a frequency of from 3 to 30 MHz and a second high-frequency electric power with a frequency of from 30 to 300 MHz.

* * * * *